US010582639B1

(12) United States Patent
Chopra et al.

(10) Patent No.: US 10,582,639 B1
(45) Date of Patent: Mar. 3, 2020

(54) LIQUID COOLING DISTRIBUTION IN A MODULAR ELECTRONIC SYSTEM

(71) Applicant: CISCO TECHNOLOGY, INC., San Jose, CA (US)

(72) Inventors: Rakesh Chopra, Menlo Park, CA (US); Mandy Hin Lam, Fremont, CA (US); M. Baris Dogruoz, Santa Clara, CA (US)

(73) Assignee: CISCO TECHNOLOGY, INC., San Jose, CA (US)

(*) Notice: Subject to any disclaimer, the term of this patent is extended or adjusted under 35 U.S.C. 154(b) by 0 days.

(21) Appl. No.: 16/131,629

(22) Filed: Sep. 14, 2018

(51) Int. Cl.
*H05K 7/20* (2006.01)
*H05K 7/02* (2006.01)

(52) U.S. Cl.
CPC ......... *H05K 7/20218* (2013.01); *H05K 7/026* (2013.01)

(58) Field of Classification Search
CPC ...... G06F 1/20; G06F 2200/201; G06F 1/206; G06F 1/187; G06F 1/183; H01L 2924/00; H01L 23/473; H05K 7/20809; H05K 7/20327; H05K 7/203; H05K 7/20818; H05K 7/20736; H05K 7/20509; H05K 7/20254; H05K 7/20218; H05K 7/20281; H05K 7/208; H05K 7/20927; H05K 7/20745; H05K 7/2079; H05K 7/20836; H05K 7/20; H05K 7/20336; H05K 7/20381; H05K 7/20781; H05K 1/0272; H05K 2201/064; F28D 15/00; F28D 15/02; F28D 2015/0216; F28D 2021/0031; F28F 3/12; F28F 9/26; F28F 13/02; F28F 13/06; F28F 2260/02; H01M 10/613; H01M 2/1077; H01M 10/6567
USPC .... 361/679.47, 679.46, 679.48, 679.53, 699, 361/622, 701, 704, 752, 796; 165/104.19, 165/104.33, 80.4
See application file for complete search history.

(56) References Cited

U.S. PATENT DOCUMENTS

| | | | |
|---|---|---|---|
| 6,855,881 B2 | 2/2005 | Khoshnood | |
| 8,276,397 B1 | 10/2012 | Carlson et al. | |
| 8,700,923 B2 | 4/2014 | Fung | |
| 8,842,430 B2 | 9/2014 | Hellriegel et al. | |
| 9,273,906 B2 | 3/2016 | Goth et al. | |
| 9,510,479 B2 | 11/2016 | Vos | |
| 9,693,244 B2 | 6/2017 | Maruhashi et al. | |
| 2005/0207116 A1* | 9/2005 | Yatskov | H05K 7/20745 361/690 |
| 2010/0014248 A1* | 1/2010 | Boyden | H05K 7/20563 361/695 |
| 2012/0064745 A1 | 3/2012 | Ottliczky | |

(Continued)

FOREIGN PATENT DOCUMENTS

CN 201689347 U 12/2010

*Primary Examiner* — Mandeep S Buttar
(74) *Attorney, Agent, or Firm* — Cindy Kaplan

(57) ABSTRACT

In one embodiment, an apparatus includes a chassis comprising a plurality of slots for receiving a plurality of modules, a first group of the modules received in a first orientation and a second group of the modules received in a second orientation orthogonal to said first orientation, and a coolant distribution module inserted into one of the slots in the first orientation for distributing coolant to at least one of the modules in the second group of modules. A method for distributing coolant to the modules is also disclosed herein.

21 Claims, 21 Drawing Sheets

(56) References Cited

U.S. PATENT DOCUMENTS

| | | | | |
|---|---|---|---|---|
| 2012/0201089 | A1 | 8/2012 | Barth et al. | |
| 2012/0327597 | A1* | 12/2012 | Liu .................... | H05K 7/20736 361/692 |
| 2013/0077923 | A1 | 3/2013 | Weem et al. | |
| 2016/0262288 | A1 | 9/2016 | Chainer et al. | |
| 2017/0049009 | A1* | 2/2017 | Steinke ............. | H05K 7/20781 |

* cited by examiner

LIQUID COOLING DISTRIBUTION IN A MODULAR ELECTRONIC SYSTEM

TECHNICAL FIELD

The present disclosure relates generally to modular electronic systems, and more particularly, liquid cooling distribution in a modular electronic system.

BACKGROUND

Over the past several years, there has been a tremendous increase in the need for higher performance communications networks. Increased performance requirements have led to an increase in energy use resulting in greater heat dissipation from components. As power use increases, traditional air cooling may no longer be adequate to cool network devices and liquid cooling may be needed.

Modular electronic systems are designed to provide flexibility to configure systems as per user needs. These systems include multiple slots to accommodate a variety of modules (e.g., line cards, fabric cards, and the like). Orthogonal systems, which have cards inserted both horizontally and vertically, may present additional challenges for liquid cooling because cards often connect to the front and back of the system.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
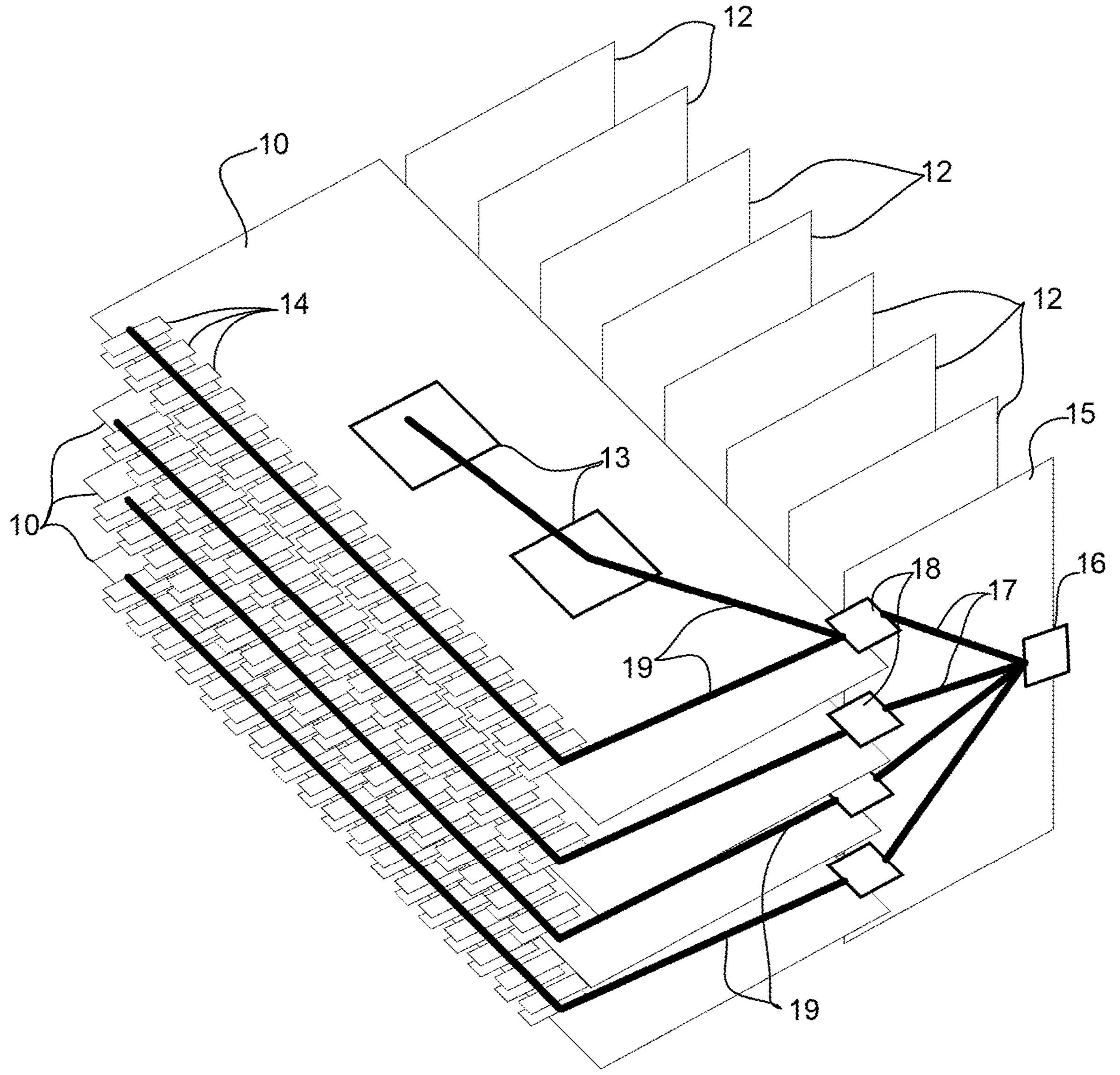
FIG. 1 illustrates liquid cooling distribution for horizontal modules in an orthogonal system, in accordance with one embodiment.

In one embodiment, an apparatus generally comprises a chassis comprising a plurality of slots for receiving a plurality of modules, a first group of the modules received in a first orientation and a second group of the modules received in a second orientation orthogonal to said first orientation, and a coolant distribution module inserted into one of the slots in the first orientation for distributing coolant to at least one of the modules in the second group of modules.

In another embodiment, an apparatus generally comprises a coolant distribution module for insertion into a chassis of a network device in a first orientation for delivering coolant to one or more modules inserted into the chassis in a second orientation orthogonal to the first orientation. The coolant distribution module comprises a plurality of internal connectors for connection to one or more of the modules and distribution lines for delivering coolant to the internal connectors.

In yet another embodiment, a method generally comprises receiving coolant at a coolant distribution module inserted into a slot of a chassis in a first orientation and delivering coolant to a plurality of modules inserted into a plurality of slots in the chassis in a second orientation orthogonal to the first orientation for cooling components on the modules.

Further understanding of the features and advantages of the embodiments described herein may be realized by reference to the remaining portions of the specification and the attached drawings.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices are moving away from traditional midplane designs to orthogonal based systems, which may include, for example, line cards inserted horizontally and fabric cards inserted vertically, leading to orthogonal orientation of the line cards and fabric cards, with each fabric card connected to all line cards and all line cards connected to all fabric cards. This direct attachment eliminates the need for a chassis midplane.

As power draw on processors and system components increases, traditional air cooling may no longer be adequate and liquid cooling may be needed. Liquid cooling provides improved efficiency and superior thermal properties over air cooling and may be essential for cooling higher power processers needed to meet future bandwidth requirements. Orthogonal based systems may pose additional challenges for implementation of liquid cooling due to circuit boards with high power components connected to the front and back of the system. Additional challenges are also presented if retrofit of air cooled systems is desired.

The embodiments described herein provide a system that may operate with liquid cooling (or liquid cooling and air cooling) through the use of one or more coolant distribution modules inserted in an orthogonal based modular electronic system. The liquid cooling may be distributed for use by one or more modules inserted horizontally, vertically, or both horizontally and vertically. One or more embodiments may support exchangeable air and liquid cooled modules in a new chassis design or adapt air cooled systems to implement liquid cooling for high heat density electronics, without the need to manage individual liquid distribution (plumbing) connections at each module. Systems configured for air cooling may be modified to support centralized liquid cooling distribution systems in accordance with one or more embodiments. For example, the embodiments described herein may be used to convert an air cooled chassis to a liquid cooled chassis, without requiring external plumbing connections for each field replaceable unit. In one or more embodiments, liquid cooling distribution may be provided through replacement of one or more field replaceable units in an existing air cooled chassis and the system may use both air cooling and liquid cooling. Thus, the embodiments allow both liquid cooled modules and air cooled modules to be used together in one chassis. As described in detail below, a horizontal adapter card (coolant distribution module) may be used to provide liquid cooling to vertical modules (e.g., fabric cards), a vertical adapter card (coolant distribution module) may be used to provide liquid cooling to horizontal modules (e.g., line cards), or both a horizontal adapter card and vertical adapter card may be used to provide liquid cooling to horizontal and vertical modules. The centralized coolant distribution eliminates the need to manually connect and disconnect plumbing for OIR (Online Installation and Removal) of field replaceable units (e.g., line cards, fabric cards). In one or more embodiments, a minimal amount of external plumbing connections may be used with a central coolant distribution system that manages individual field replaceable units. In one or more other embodiments a self-contained cooling system may be used to off-load thermal load from the line cards or fabric cards without any external plumbing.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. One or more of the network devices may comprise a modular electronic system comprising a liquid cooling distribution system described herein. The network device may include one or more processor, memory, and network interfaces, with one or more of these components located on a module (e.g., line card, fabric card) removably inserted into the network device.

It is to be understood that the term "module" as used herein may refer to any modular electronic component, field replaceable unit, line card, fabric card, service card, or other card, element, or component configured for insertion and removal from a chassis of a modular network device. In the examples described herein, line cards are inserted horizontally into the chassis and fabric cards are inserted vertically (orthogonal to the line cards) in the chassis, however, any type of module (e.g., line card, fabric card, or other card) may be positioned orthogonal to any other type of module. The term "orthogonal" as used herein generally describes a relationship between two geometric constructions in which the two geometric constructions are disposed at substantially 90° degrees to one another. The terms horizontal and vertical as used herein are relative terms and if the chassis is mounted on its side, the horizontal modules would be mounted vertically and the vertical modules would be mounted horizontally.

Also, it is to be understood that the term "liquid cooling" as used herein may refer to any coolant fluid (liquid, gas, or multi-phase) as to distinguish it from "air cooling" provided by conventional fans. The coolant may comprise, for example, liquid (e.g., water, water/glycol (e.g., 80% water, 20% glycol)), electrically non-conductive fluids/liquids, gaseous refrigerants, or mixed-phase coolants (partially changing from liquid to gas along the coolant loop). The coolant may also be compressed gas that is delivered to cool the modules and then released to an open environment, thereby eliminating the need for a return line. The coolant may be provided by a source of low-temperature supply coolant that is sent through distribution plumbing, as described below, and routed through elements inside the network device (e.g., components on a module (line card, fabric card, or other field replaceable unit)). Warmed coolant may be aggregated through a return manifold where it passes through a heat exchanger to remove the heat from the coolant loop to an external cooling plant, with the cycle then repeating. The heat exchanger may be a liquid-liquid heat exchanger or a liquid-air heat exchanger, with fans provided to expel the waste heat to the atmosphere, for example. The heat exchanger may be located within the network device, adjacent to the network device, or remote from the network device at a central location that services any number of network devices. For example, the heat exchanger may be located within the same rack as the network device or the system may be connected to a building wide liquid cooling distribution system. In one or more embodiments, the heat exchanger may comprise two isolated fluid channels. If the coolant flow stops from one channel, the other channel may supply enough coolant to keep the critical components operational. Isolation may be provided to prevent loss of pressure in one fluid loop from also affecting the pressure in the redundant loop.

Pumps for coolant distribution may be located external to the network device or within the modular electronic system. Additional pumps may also be located as needed within the coolant loop (e.g., on the coolant distribution modules, on liquid cooled cards, or other locations). In one or more embodiments, various sensors may monitor aggregate and individual branch coolant temperatures, pressures, flow rate quantities, or any combination thereof, at strategic points around the loop to identify loss of coolant or cooling.

In one or more embodiments an apparatus comprises a chassis comprising a plurality of slots for receiving a plurality of modules, a first group of modules received in a first orientation and a second group of modules received in a second orientation orthogonal to the first orientation, and a coolant distribution module configured for insertion into one of the slots in the first orientation and distributing coolant to at least one of the modules in the second group of modules for cooling components (electronics, optics) on the module. A second coolant distribution module may be inserted into one of the slots in the second orientation for distributing coolant to at least one of the modules in the first group of modules.

Referring now to the drawings, and first to FIG. 1, a plurality of modules (e.g., line cards 10, fabric cards 12) are shown arranged orthogonal to one another (i.e., edges/longitudinal surfaces of line cards and fabric cards are orthogonal (perpendicular) to one another). In this example, the line cards 10 are positioned horizontally and the fabric cards 12 are positioned vertically. For simplification only four line cards 10 and seven fabric cards 12 are shown and the chassis supporting the modules is not shown. Also, orthogonal data connectors between the horizontal line cards and vertical fabric cards are not shown, for simplification. It is to be understood that the system may include any number or type of modules 10, 12 with a first group of modules inserted in a first orientation and a second group of modules inserted in a second orientation orthogonal to the first orientation. As shown in the simplified schematic in FIG. 1, each line card 10 may include any number of electrical components 13 (e.g., ASIC (Application Specific Integrated Circuit) or other integrated circuit, chip, processor, or high heat density electronic component), optical components 14 (e.g., optical transceivers), or other components in which heat dissipation capability of the component is insufficient to moderate its temperature. Each module 10, 12 may include any number of components 13, 14, with liquid cooling provided to one or more of the components. As previously noted, air cooling (e.g., provided by one or more fans) may also be provided to cool one or more components or modules that do not receive liquid cooling or to provide additional cooling along with the liquid cooling.

In the example shown in FIG. 1, a vertical adapter card (also referred to herein as a coolant distribution module) 15 receives coolant at connector 16 (external plumbing connection) and distributes coolant via distribution lines 17 to each of the horizontal line cards 10 through a coupling 18 (e.g., quick disconnect or other pluggable liquid cooling connection) connected to distribution lines 19 passing through electronic components 13, 14. It is to be understood that the location of the vertical adapter card 15 shown in FIG. 1 is only an example and that the vertical adapter card may be located within any vertical slot in place of any of the fabric cards 12 and more than one vertical adapter card 15 may be used. The connector 18 and plumbing 19 may therefore be located at different locations along the edge of the line card 10 to mate with the coolant distribution module 15 inserted into different vertical slots within the chassis.

Figure 2:
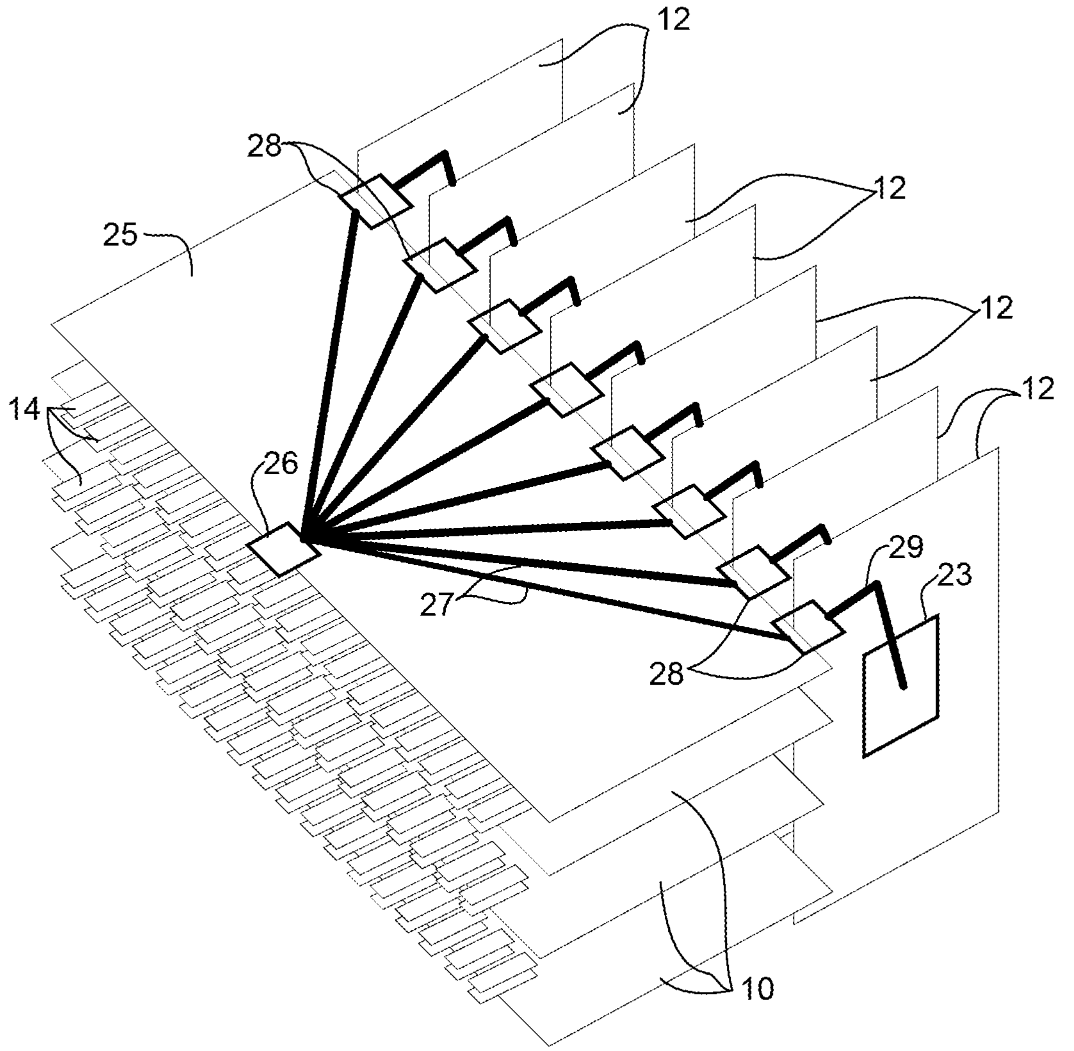
FIG. 2 illustrates liquid cooling distribution for vertical modules in the orthogonal system, in accordance with one embodiment.

Referring now to FIG. 2, an example is shown in which liquid cooling is provided to the vertical cards 12 through use of a horizontal adapter card (also referred to herein as a coolant distribution module) 25. Liquid coolant supply is received at external plumbing connection 26 and provided via distribution lines 27 to each of the vertical fabric cards 12 at couplings 28 (e.g., quick disconnect or other pluggable liquid cooling connection) connected to lines 29 to cool electronic components 23 on the fabric cards 12. As previously noted with respect to FIG. 1, the horizontal adapter card 25 may be inserted into any horizontal slot and more than one card 25 may be used.

Figure 3:
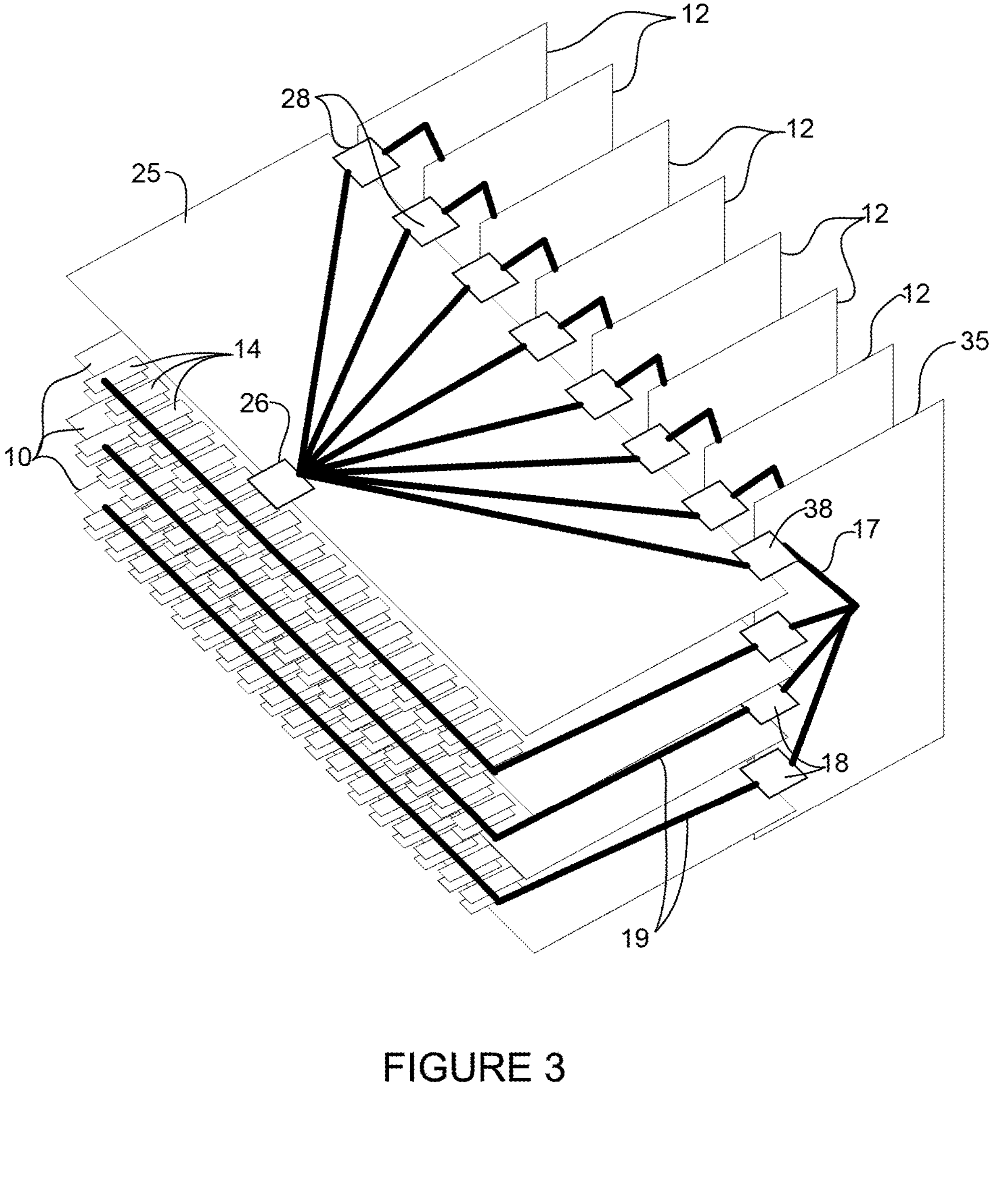
FIG. 3 illustrates liquid cooling distribution for both horizontal and vertical modules in the orthogonal system, in accordance with one embodiment.

FIG. 3 illustrates an example in which liquid cooling is provided for both the horizontal cards 10 and vertical cards 12. In this example, one horizontal module (line card) 10 and vertical module (fabric card) 12 are replaced with coolant distribution modules 25, 35, respectively. The external plumbing connection 26 distributes fluid through the horizontal adapter card 25 to the vertical cards 12 (as described above with respect to FIG. 2) and also supplies coolant to a vertical adapter card 35 at connector 38, which distributes coolant through distribution lines 17 to couplings 18 connected to each horizontal card 10 (as described above with respect to FIG. 1). This eliminates the need for an external plumbing connection at vertical adapter card 35. As previously described, more than one horizontal adapter card 25 or vertical adapter card 35 may be used to provide redundancy or additional cooling capacity.

It is to be understood that the liquid cooling distribution systems shown in FIGS. 1, 2, and 3 are only examples and that other distribution configurations may be used, without departing from the scope of the embodiments. For example, any number of horizontal line cards 10 (e.g., none, one, some, or all) may be configured to receive liquid cooling and any number of vertical modules 12 (e.g., none, one, some, or all) may be configured to receive liquid cooling, with any remaining cards air cooled by fans. Thus, conventional line cards or fabric cards that are air cooled by fans and not configured for liquid cooling may be used with the coolant distribution module in place. The chassis may be configured to have dedicated slots for the coolant distribution modules 15, 25, 35 or a conventional chassis may use one or more existing line card or fabric card slots to receive the coolant distribution module.

In the examples shown herein, external plumbing connections 26 are provided on a front face plate of the horizontal adapter card 25. The external plumbing connections may also be located on a side, rear, or top of the chassis. For example, in one or more embodiments, external plumbing may be provided from the rear for the vertical adapter card to provide cooling to horizontal line cards 10 and to a horizontal adapter card, which in turn provides cooling to vertical fabric cards 12. Coolant distribution may be provided from a rear of the chassis, for example, by passing coolant lines through a fan tray designed to provide space for the coolant lines. Also, one or more fans may be removed to provide room for coolant distribution or the lines may pass through a space within the fan tray, between, above, or below, the fans, for example. The coolant distribution lines may also pass through an access panel on the side or top of the chassis.

Figure 4:
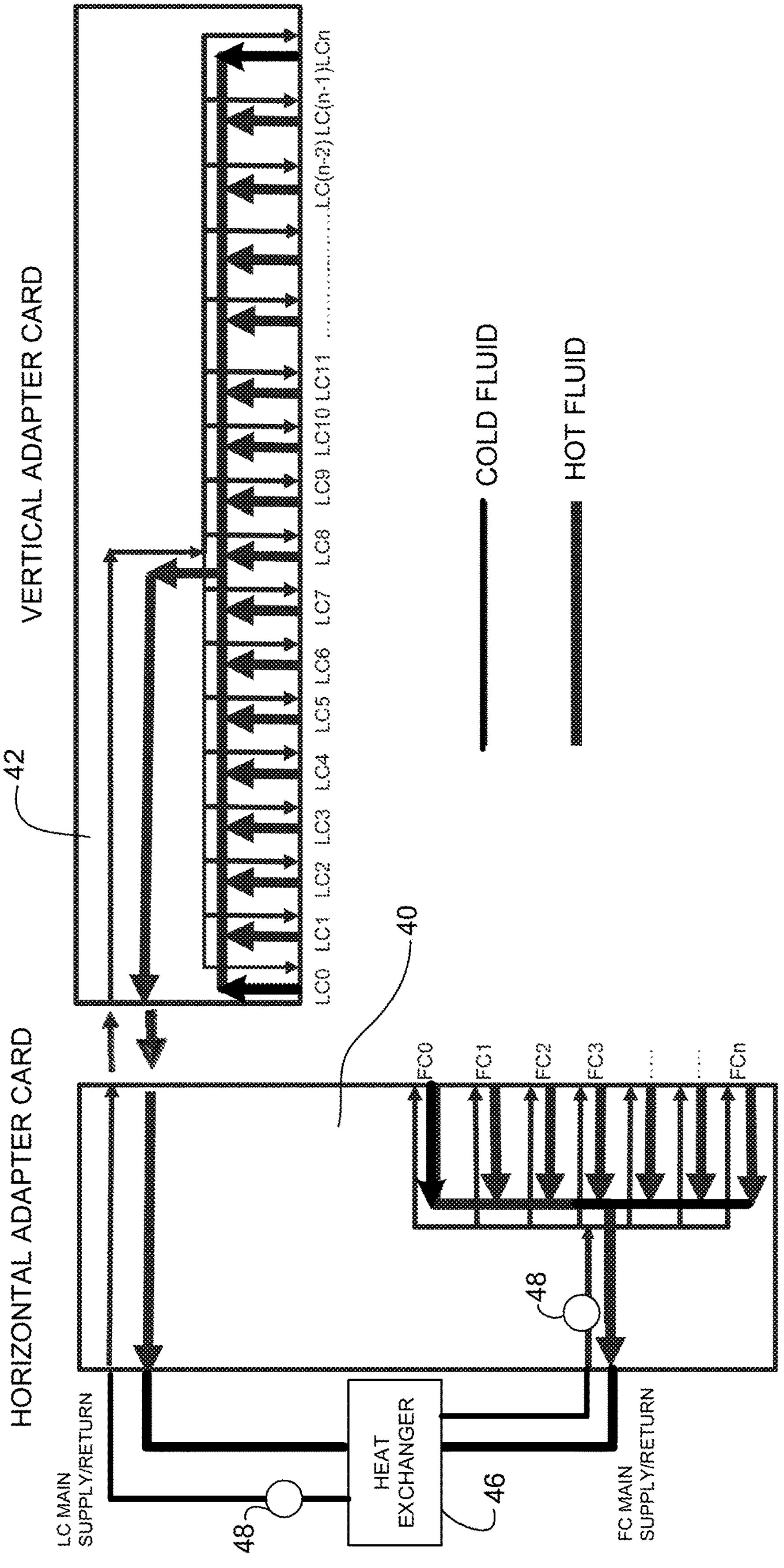
FIG. 4 is a schematic illustrating liquid cooling distribution in coolant distribution modules of the orthogonal system of FIG. 3, in accordance with one embodiment.

FIG. 4 is a fluid schematic showing an overview of the coolant distribution within horizontal adapter card (coolant distribution module) 40 and vertical adapter card (coolant distribution module) 42, in accordance with one embodiment. In this example, the horizontal adapter card 40 includes two external plumbing connections, one for delivering coolant to the vertical adapter card 42 (LC Main Supply/Return) and the other for delivering coolant to the vertical fabric cards (FC Main Supply/Return). The LC Main Supply/Return provides coolant to the vertical adapter card 42, which in turn delivers coolant to one or more horizontal line cards (LC0 . . . LCn). The FC Main Supply/Return provides coolant to one or more fabric cards (FC0 . . . FCn) through the horizontal adapter card 40.

The distribution plumbing comprises supply lines (cold fluid) and return lines (hot/warm fluid). Separate tubing may be provided for the supply and return lines, as shown in FIG. 4 or a single tube with separate conduits for supply and return may be used, with sufficient thermal isolation between the supply and return lines, which would reduce the amount of external and internal fluid connectors. As described in the examples below, distribution lines may pass above or to the side of orthogonal connectors or within the space of the connector to pass coolant lines between horizontal and vertical cards. In one example, the external connector comprises a supply coupling for receiving cold fluid and a return coupling for returning hot/warm fluid after cooling components on the line cards and fabric cards. The external connector may comprise two separate connectors for coupling two separate lines (supply and return) or a manifold comprising separate connections and internal passages, with sufficient separation between the supply and return channels.

In the example shown in FIG. 4, the LC Main Supply/Return and FC Main Supply/Return are each in fluid communication with an external heat exchanger 46. As described below, the horizontal adapter card 40 may comprise two pairs of external connectors (supply/return for line card cooling and supply/return for fabric card cooling). The fluid distribution lines may also be aggregated within the horizontal adapter card and only one pair of connectors (supply/return) used. Also, the horizontal line card 40 and vertical adapter card 42 may each have their own external connections in fluid communication with one or more heat exchanger 46. Each coolant loop may comprise one or more pumps 48 external to the chassis or located on the coolant distribution module. In another example, the coolant distribution module may include a pump to off-load thermal load from the modules without the need for external plumbing.

The size of the fluid distribution lines may be determined based on the number of modules to be cooled and the thermal capacity of the modules. For example, different capacity coolant distribution modules may be used based on the number of modules to be cooled using liquid cooling (e.g., one to seventeen (or more) lines cards and one to seven (or more) fabric cards). Flow network modeling may be performed to take into account pumps, quick disconnects, and fluid lines, as well as the number of modules. Flow network modeling may also be performed on the cards, taking into account the cooling distribution system on the cards, including fittings, tees, elbows, cold plates, or any other parts of the distribution system, and flow pressure and temperature distribution over the card. Hydraulic and thermal resistance of cold plates and cards may be determined and optimized. The heat exchanger may be sized to adequately remove heat produced by the cards via the coolant distribution system.

Figure 5:
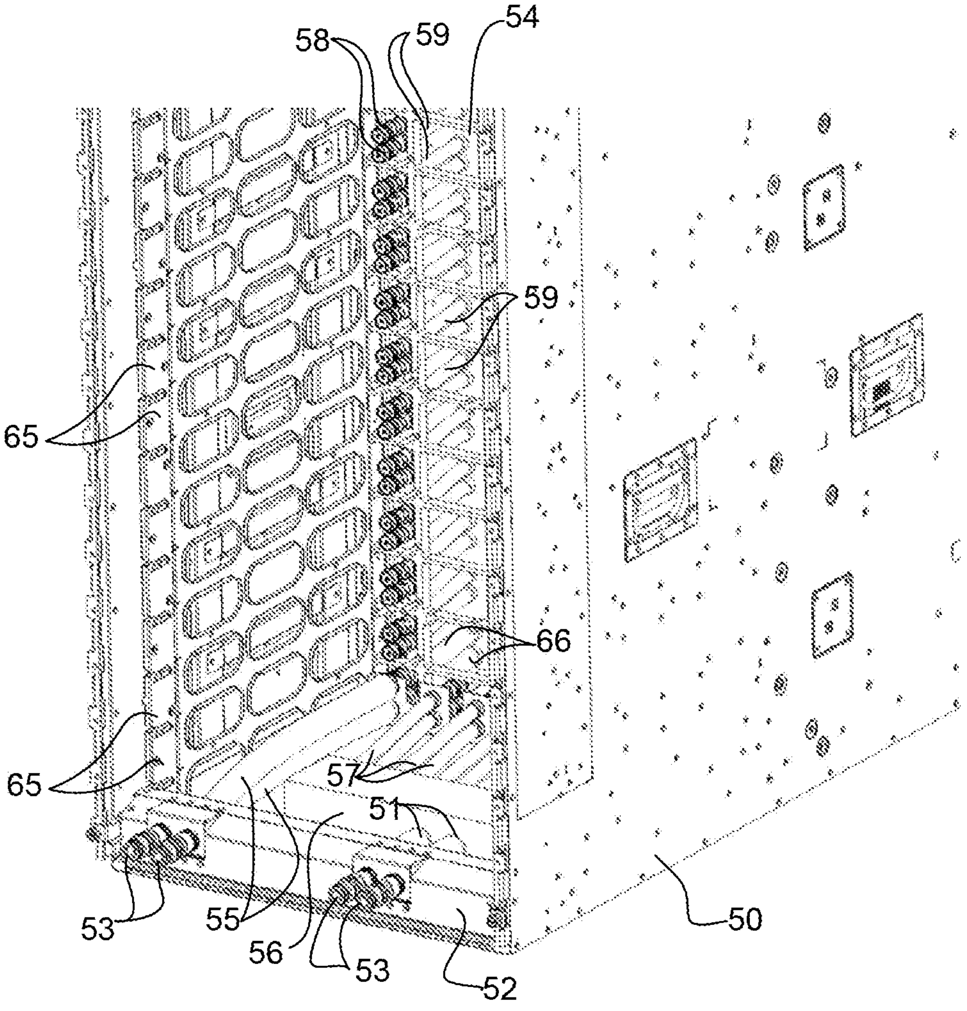
FIG. 5 is a partial front perspective illustrating the coolant distribution modules inserted into a chassis, in accordance with one embodiment.

FIG. 5 is a front perspective of a chassis 50 with a horizontal card adapter (coolant distribution module) 52 and vertical card adapter (coolant distribution module) 54 installed. The chassis 50 may include one or more frames or structures configured to support components and slidably receive any number of removable modules (adapter cards, line cards, fabric cards, or other removable modules). The chassis frame 50 may be formed from any suitable material including, for example, aluminum, steel, or any other metal, non-metal, or composite material.

As described above with respect to FIG. 4, in one or more embodiments, the horizontal coolant distribution module 52 may include two pairs of external connectors 53, each pair comprising a supply line connector and a return line connector. The connector 53 may be a quick disconnect or any other suitable connector that prevents loss of fluid when disconnected from associated external cooling lines. In this example, two external connectors 53 are coupled to supply and return lines 55 for supply and return of coolant to and from the vertical adapter card 54 via distribution lines 66. The vertical adapter card 54 distributes coolant to and receives return coolant from horizontal line cards (not shown) at connectors 58 (internal connectors) via coolant distribution lines 59. The other two external connectors 53 are coupled to coolant distribution lines 51 attached to a manifold 56 configured to supply (distribute) coolant to and receive (aggregate) return coolant from vertical fabric cards (not shown) via lines 57. The lines 51, 55, 57, 59 are suitably sized to provide sufficient flow for cooling components on the modules, as previously described. As noted above, the supply and return lines may be combined into a single line comprising isolated supply and return conduits.

Figure 6:
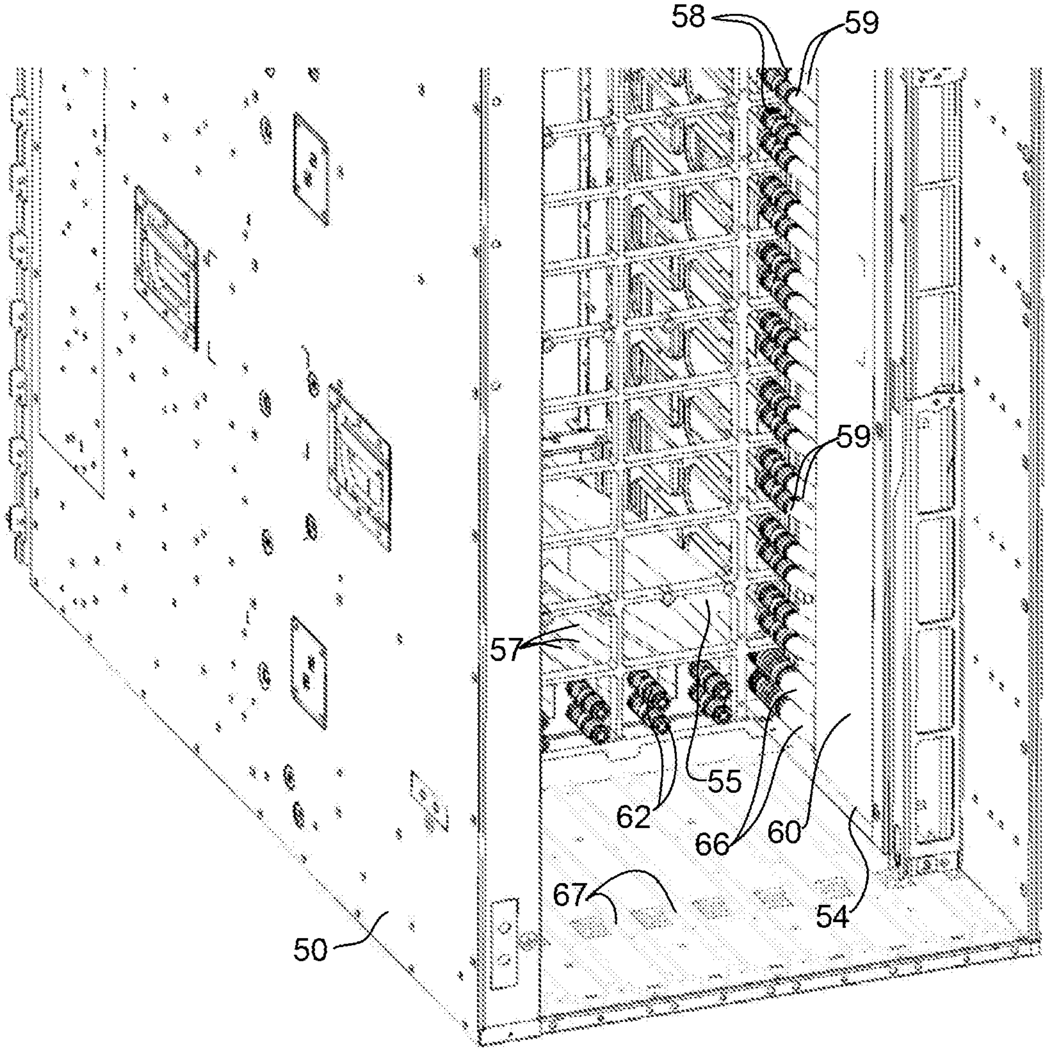
FIG. 6 is a partial rear perspective of the chassis and coolant distribution modules of FIG. 5.

FIG. 6 is a rear perspective of the chassis 50 shown in FIG. 5. The vertical adapter card 54 comprises a manifold 60 for distribution of the supply coolant and aggregation of the return coolant via lines 59 coupled to connectors 58 for attachment to the horizontal line cards (not shown). The coolant lines 57 of the horizontal adapter card 52 are coupled to connectors 62 at their open ends for attachment to the vertical fabric cards (not shown). As shown in the example of FIGS. 5 and 6, the horizontal adapter card 52 and horizontal line cards are installed from a front of the chassis 50 into slots 65, and the vertical adapter card 54 and vertical fabric cards are installed from a rear of the chassis into slots 67.

It is to be understood that the type, number, and arrangement of slots 65, 67 and adapter cards 52, 54 shown in FIGS. 5 and 6 is only an example and the chassis may include any number of slots for receiving any number or type of modules, including, for example, fabric cards, line cards, service cards, combo cards, controller cards, processor cards, high density line cards, high power line cards, or high density and power line cards, arranged in any format (e.g., positioned horizontally or vertically). Also, as previously noted, the adapter cards 52, 54 may be inserted into any slot 65, 67 within the chassis 50.

As previously noted, one or more of the line cards or fabric cards may not be configured for liquid cooling and only air cooled. Thus, the coolant distribution lines 57, 59 and internal connectors 58, 62 are preferably configured so as not to interfere with orthogonal connectors on conventional air cooled cards, and may be offset or recessed as described below.

Figure 7:
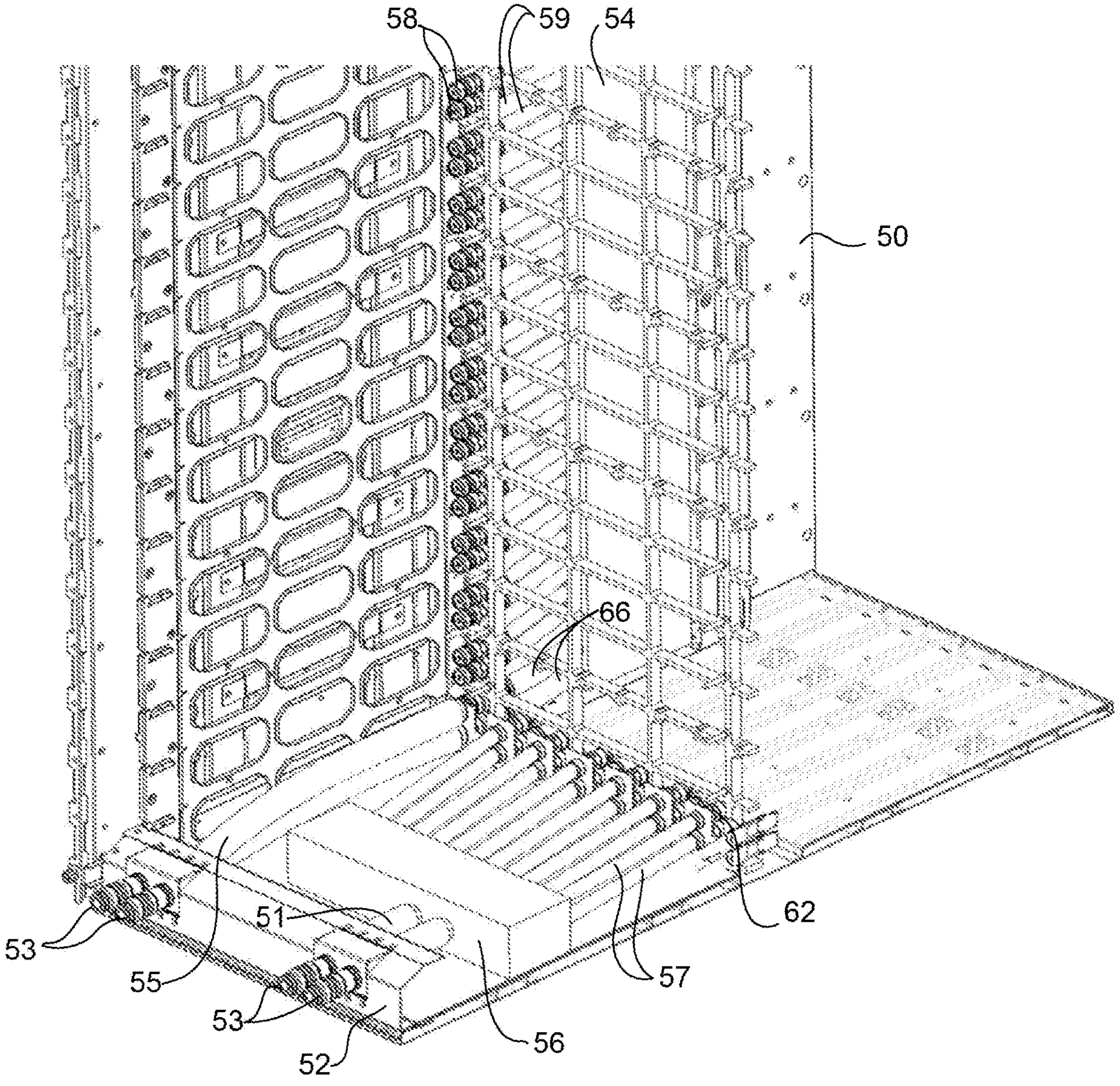
FIG. 7 is the front perspective shown in FIG. 5 with a portion of the chassis removed to show detail.
Figure 8:
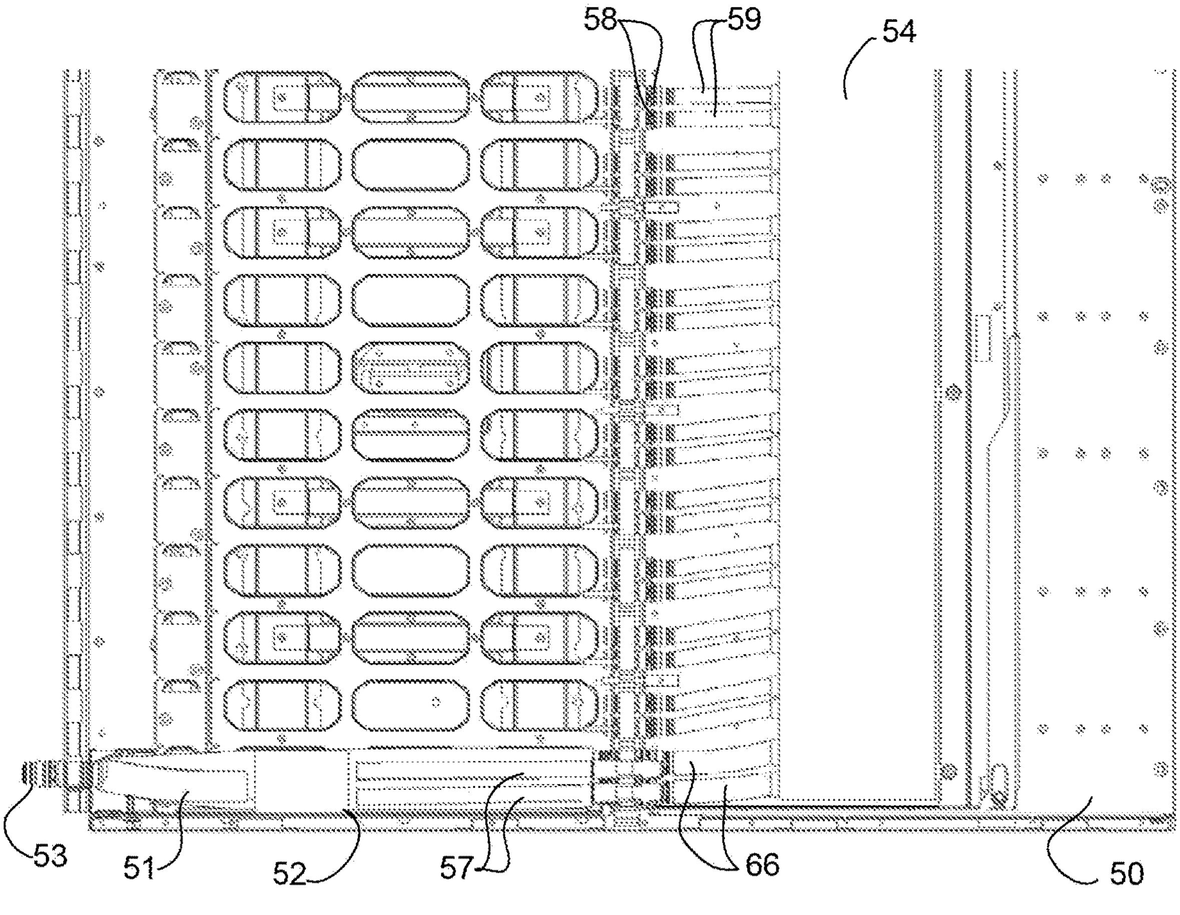
FIG. 8 is a side view of the chassis and coolant distribution modules shown in FIG. 7.

FIGS. 7 and 8 are a perspective and side view, respectively, of the chassis 50 shown in FIGS. 5 and 6, with a wall of the chassis removed to show additional detail of the horizontal adapter card 52 and vertical adapter card 54, including distribution lines 51, 55, 57, 59, 66, external and connectors 53 and internal connectors 58, 62. As shown in FIG. 7, the coolant distribution lines (supply and return) 55 in fluid communication with the vertical adapter card 54 may have a larger diameter than coolant lines 57, which are sized for coolant distribution to individual vertical fabric cards and return from the fabric cards. Similarly, coolant lines 66 coupled to lines 51 may have a larger diameter than lines 59, which are sized for coolant distribution to individual horizontal line cards and return from the line cards. Lines 51 provide coolant to or receive coolant from the manifold 56 and are also sized for higher flow.

Figure 9:
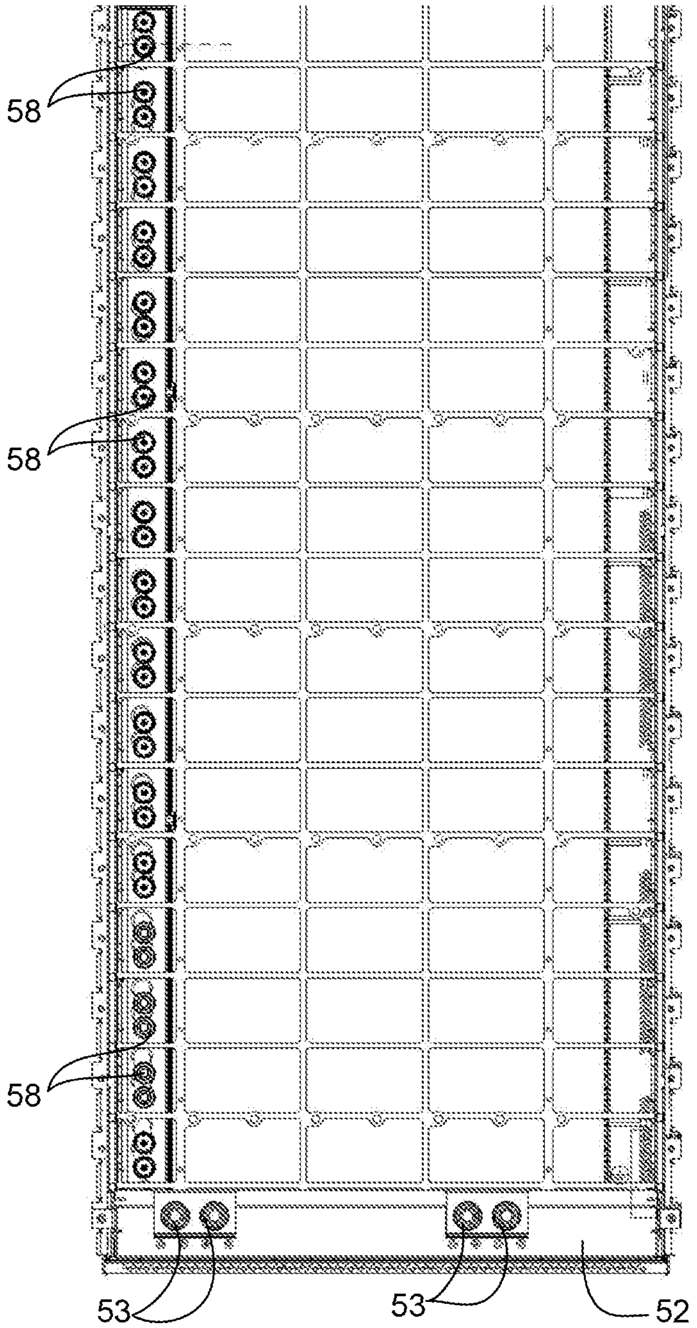
FIG. 9 is a front view of the chassis and coolant distribution modules shown in FIG. 5.
Figure 10:
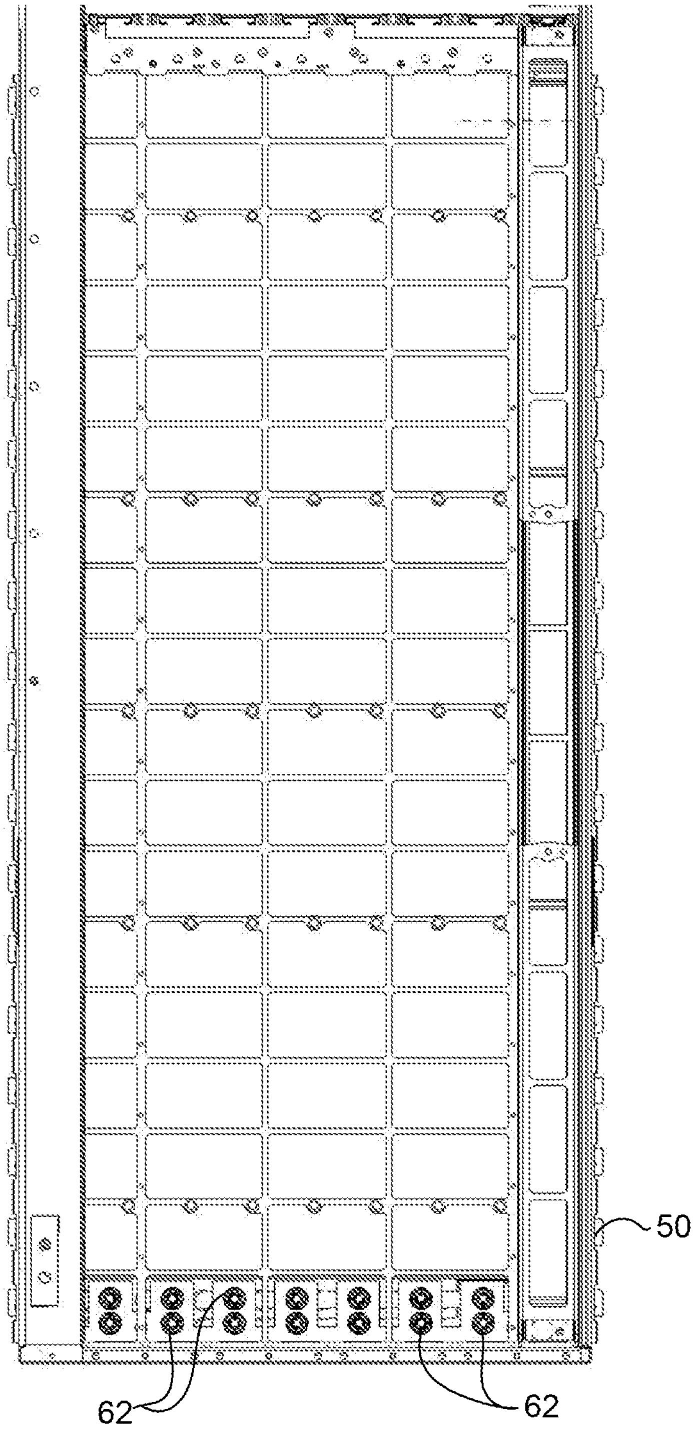
FIG. 10 is a rear view of the chassis and coolant distribution modules shown in FIG. 6.

FIG. 9 is a front view of the chassis 50 showing the external connectors 53 for the horizontal adapter card 52 and internal connectors 58 for coolant flow to and from horizontal line cards (not shown). FIG. 10 is a rear view of the chassis 50 showing internal connectors 62 for distribution of coolant to and receiving return flow from the vertical fabric cards (not shown).

Figure 11:
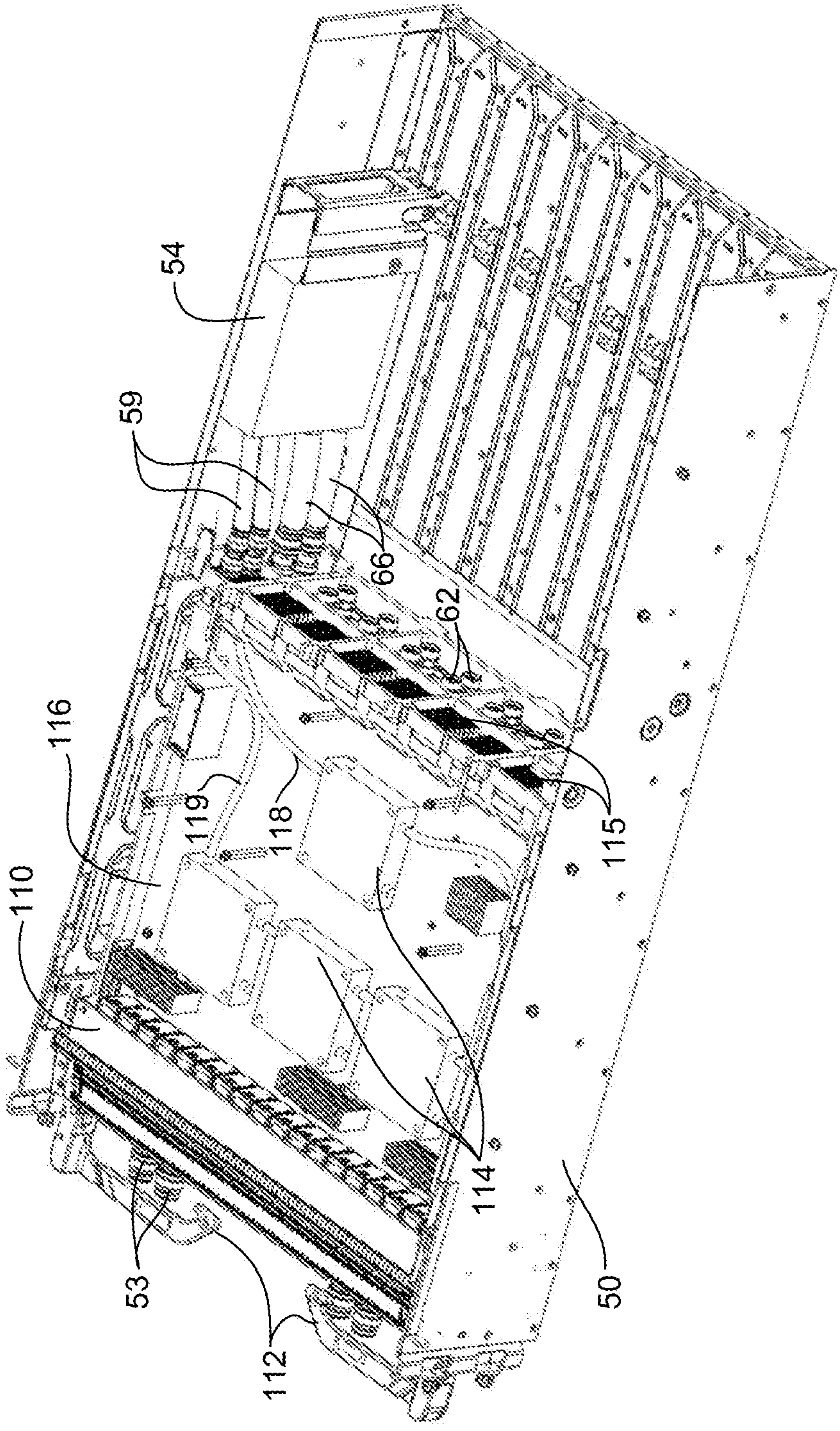
FIG. 11 is a cutaway perspective showing a liquid cooled line card inserted into the chassis with the coolant distribution modules.

FIG. 11 is a top cutaway perspective of a horizontal line card (module) 110 installed in a slot of the chassis 50. In this example, the line card 110 is installed in the slot immediately above the horizontal adapter card. The line card 110 receives coolant at supply line 59, which is delivered to electronic components 114 via line 118 and hot/warm coolant is returned through line 119 to the vertical adapter card 54. The line card 110 includes quick disconnects for mating with the internal connectors 59 of the vertical adapter card 54. The line card 110 may include one or more electronic circuits and components 114 on a printed circuit board 116 and data interfaces (orthogonal connectors) 115 for mating with vertical fabric cards. The line card 110 may include a plurality of ports or other openings configured to receive connectors, cables, or pluggable transceiver modules (e.g., small form factor pluggable (SFP) transceiver modules, optical transceiver modules, etc.). The line card 110 may comprise one or more handles (arms) 112 for use in inserting or removing the line card from the chassis 50.

FIGS. 12A, 12B, 13A, 13B, 14, 15A, and 15B illustrate details of the coolant distribution modules (horizontal adapter card 52, vertical adapter card 54), in accordance with one embodiment. As previously described, the coolant distribution module is configured for insertion into the chassis 50 of a network device in a first orientation for delivering coolant to at least one of the modules (line card, fabric card) inserted into the chassis in a second orientation orthogonal to the first orientation for cooling components on the module. The coolant distribution module comprises a plurality of internal connectors for connection to one or more of the modules and coolant distribution lines for delivery of coolant from the external connectors to the internal connectors.

Figure 12A:
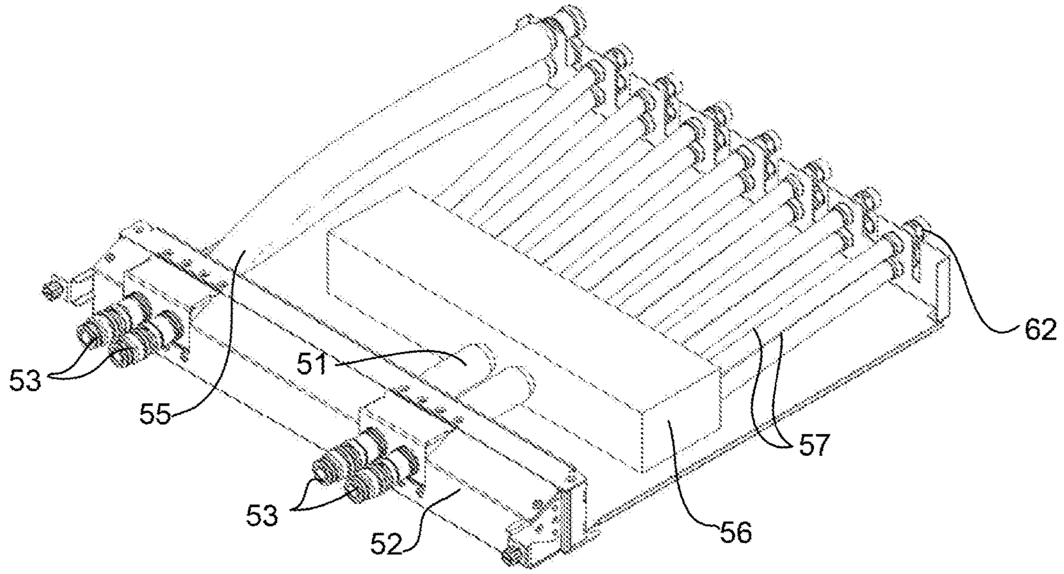
FIG. 12A is a front perspective of the horizontal coolant distribution module.
Figure 12B:
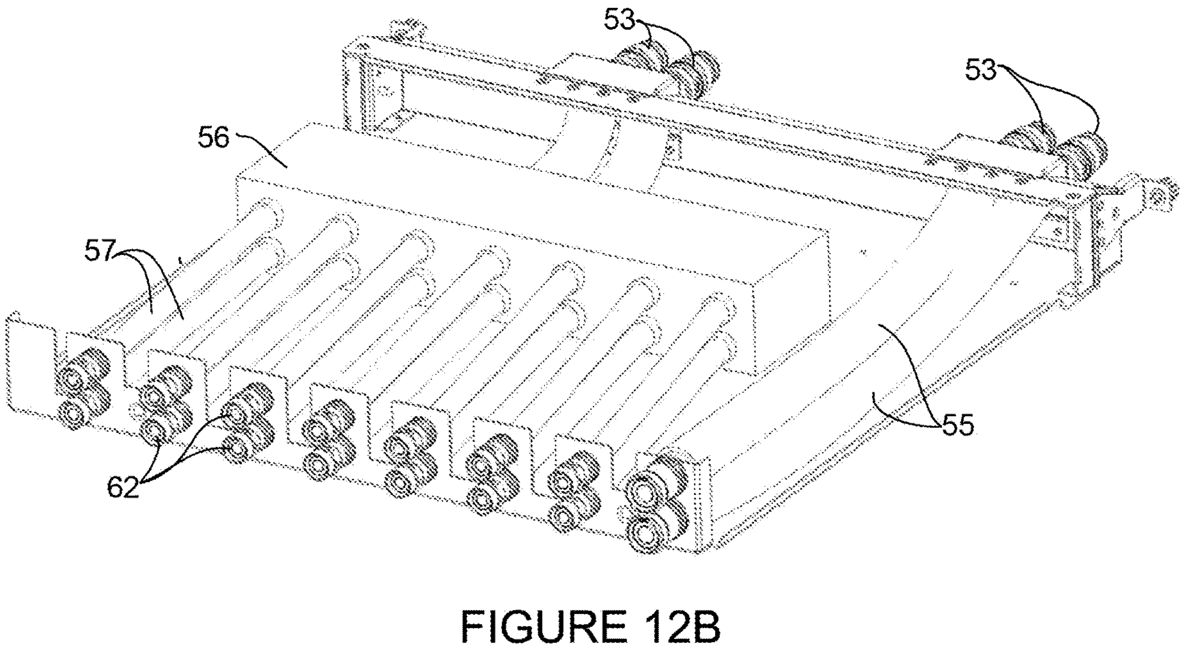
FIG. 12B is a rear perspective of the horizontal coolant distribution module.
Figure 13A:
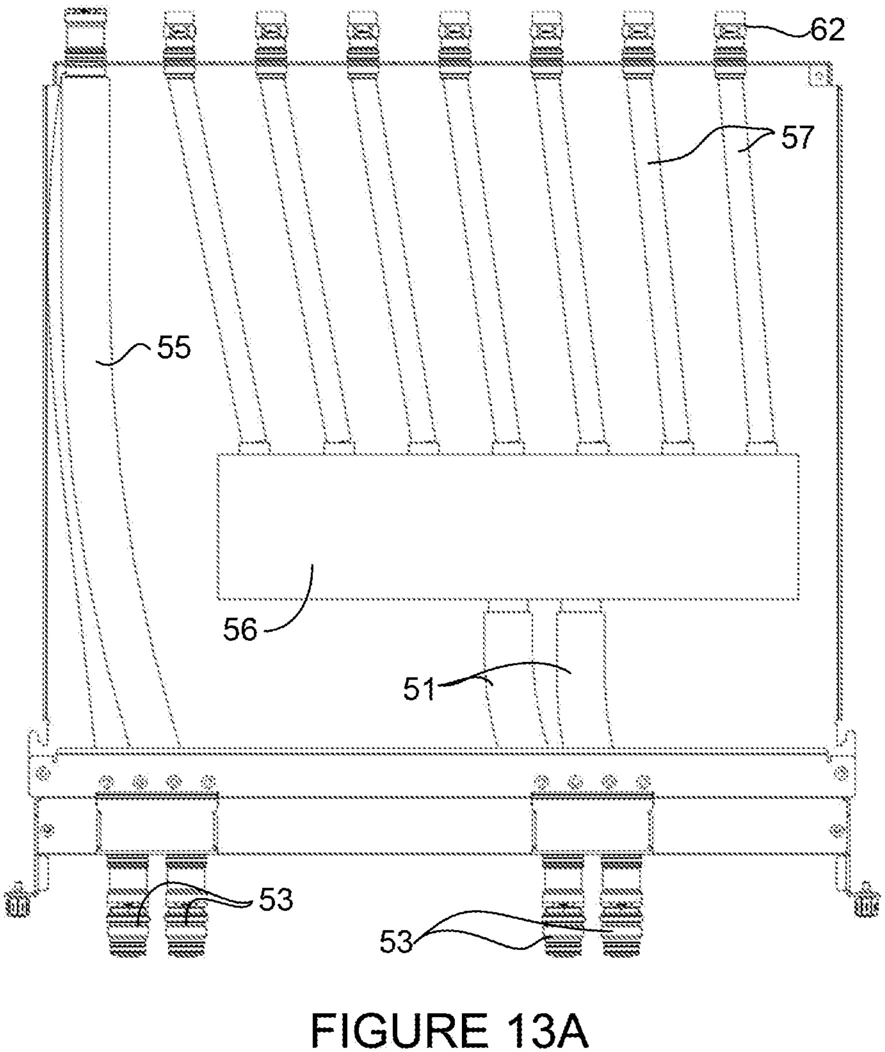
FIG. 13A is a top view of the horizontal coolant distribution module.
Figure 13B:
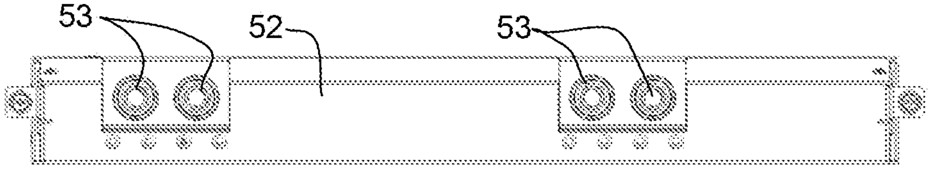
FIG. 13B is a front view of the horizontal coolant distribution module.

FIGS. 12A and 12B are perspective views, FIG. 13A is a top view, and FIG. 13B is a front view (e.g., front of chassis 50) of the horizontal adapter card 52. As previously described, the horizontal adapter card 52 comprises two pairs of external connectors (quick disconnects) 53 attached to lines 55 for fluid communication with the vertical adapter card, and lines 51 connected to manifold 56, which is also attached to a plurality of lines 57 for fluid communication with the vertical fabric cards. In this example, the external quick disconnects 53 are located on a front face plate of the adapter card 52 for easy access. As previously noted, the external connectors may also be located on a rear, top, or side panel of the chassis.

Figure 14:
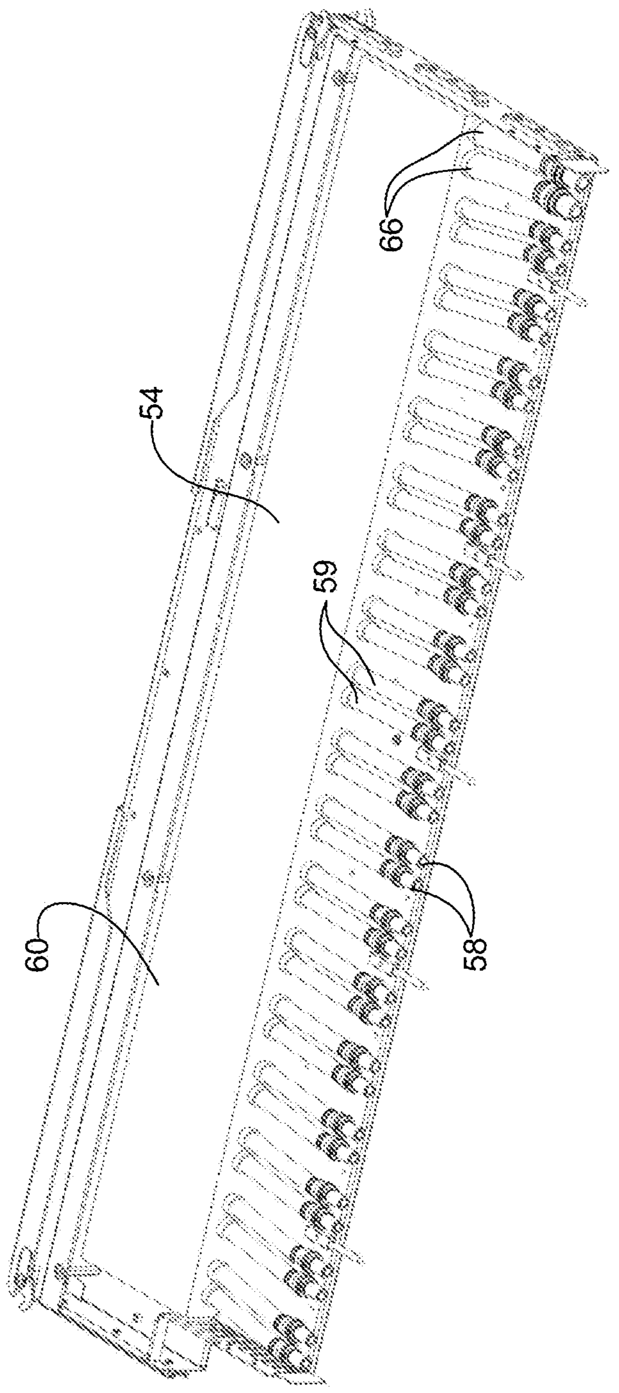
FIG. 14 is a perspective of the vertical coolant distribution module.
Figure 15A:
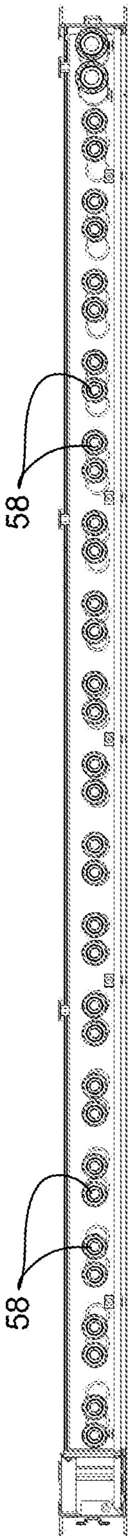
FIG. 15A is a front view of the vertical coolant distribution module.
Figure 15B:
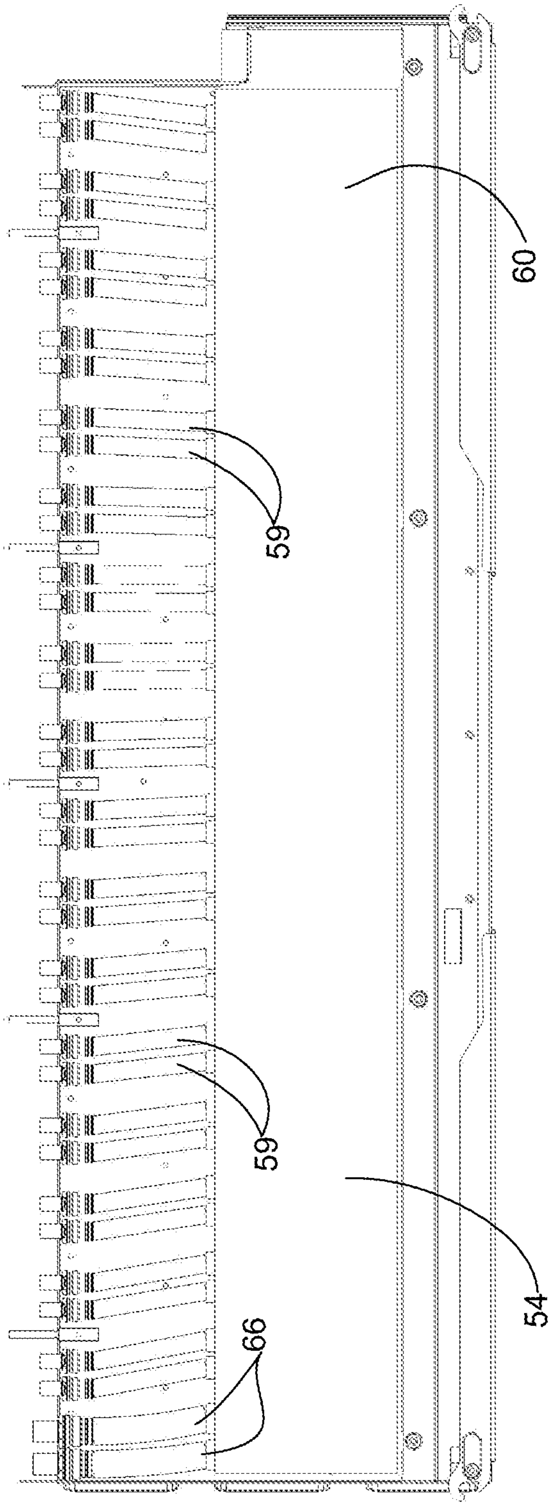
FIG. 15B is a side view of the vertical coolant distribution module.

FIG. 14 is a perspective, FIG. 15A is a front view (e.g., front of chassis), and FIG. 15B is a side view of the vertical adapter card 54, in accordance with one embodiment. In this example, manifold 60 receives coolant supply from the horizontal adapter card at supply line 66 and distributes the coolant to horizontal line cards at supply lines 59. Return coolant is returned to the manifold at the return distribution lines 59, where the warm/hot coolant is aggregated and sent out return line 66 to the horizontal adapter card 52. As previously noted, the coolant may also be supplied to the vertical adapter card 54 at an external connector separate from the horizontal adapter card.

It is to be understood that the coolant distribution modules 52, 54 shown in FIGS. 12A, 12B, 13A, 13B, 14, 15A, and 15B are only examples and that other configurations may be used without departing from the scope of the embodiments. For example, as previously noted, the distribution lines 51, 55, 57, 59, 66 may be configured to carry both supply and return fluid conduits within one tube, which would reduce the number of lines and connectors in the fluid distribution system. Also, the coolant distribution system may be self-contained on one or more of the coolant distribution modules 52, 54 and include a pump and heat exchanger or heat sink to off-load thermal load from the line cards or fabric cards without the need for any external plumbing.

As previously noted, more than one coolant distribution module 52, 54 may be used to provide cooling path redundancy or additional cooling capacity. Each coolant distribution module may comprise its own external plumbing connection so that a loss of liquid cooling flow from a single external plumbing connection will not cause possible heat damage or shut down the system. Also, this would allow repair of one coolant distribution module while the other coolant distribution module carries the full system load. The dual redundant cooling loops may be managed with checks valves or completely isolated from one another.

In one or more embodiments, the coolant distribution module 52, 54 may also include sensors and control components (flow valves, pumps, restrictors) for use in meeting coolant flow requirements to each individual branch (line card, fabric card). The control system may be, for example, open loop with a manual valve set at system configuration time or a closed loop system using one or more servo valves regulated by feedback from temperature sensors or coolant return temperatures. The control system may also include a leak detection system (e.g., moisture sensor, flow sensor, pressure sensor) configured to shut off coolant flow if a leak is detected.

As previously described, the liquid cooling distribution system may be used along with conventional air cooling provided by one or more fans. In one or more embodiments, conventional line cards or fabric cards designed for only air cooling may be used along with modules configured for liquid cooling to provide backwards compatibility and allow for a mix of air cooled modules and liquid cooled modules (or air and liquid cooled modules). The horizontal and vertical coolant distribution modules 52, 54 described herein may also be inserted into a chassis in which all modules (horizontal and vertical cards) are air cooled and not configured for liquid cooling. These modules may be replaced at a later time with modules configured for liquid cooling. Various mechanisms or designs may be implemented to avoid damage to the orthogonal connector if a horizontal or vertical coolant distribution module is used with one or more conventional modules (air cooled line cards or fabric cards) that are not configured for liquid cooling. FIGS. 16, 17A, 17B, 17C, 18A, 18B, 19A, and 19B show examples of design configurations or mechanisms that may be used to prevent damage to the orthogonal connectors located at the interface between the air cooled modules (e.g., conventional line card or fabric card) and the cooling distribution module.

Figure 16:
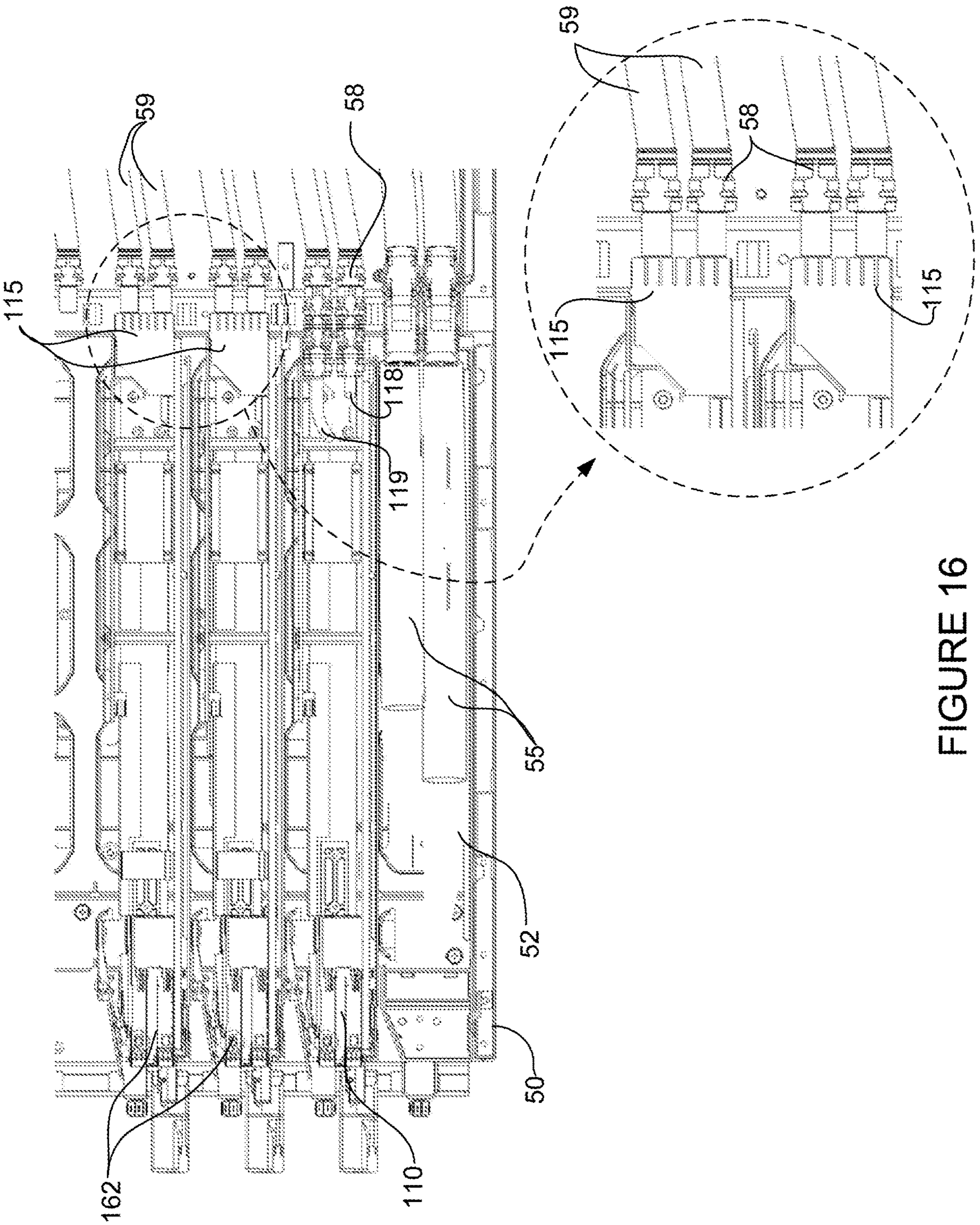
FIG. 16 is a partial side view of the chassis and coolant distribution modules with both air cooled and liquid cooled line cards with a portion of the chassis removed to show detail, in accordance with one embodiment.

FIG. 16 is a partial side view of the chassis 50 with one wall removed to show detail. In this example, one liquid cooled line card 110 is inserted into a slot immediately above the horizontal line card adapter 52. Two conventional line cards 162 inserted above the liquid cooled line card 110 are configured only for air cooling (i.e., no coolant lines). Liquid cooling connectors 58 engage with the liquid cooled card 110 on card insertion and sit recessed from orthogonal connectors 115 on the conventional air cooled cards 162 at the interface between the line card 162 and the vertical adapter card (connectors 58). The conventional line cards 162 are inserted into the slots without interference with the coolant connectors 58 and distribution lines 59 of the vertical adapter card. The cooling components (connectors 58) on the vertical adapter card are recessed from the conventional line card mating connectors 115, thus there is no interference between the vertical adapter card and line cards 162.

Similar to the example described above with respect to FIG. 16, a conventional vertical fabric card (module), which is not configured for liquid cooling, may be inserted into a chassis with a horizontal coolant distribution module for distributing coolant to at least one vertical card.

Figure 17A:
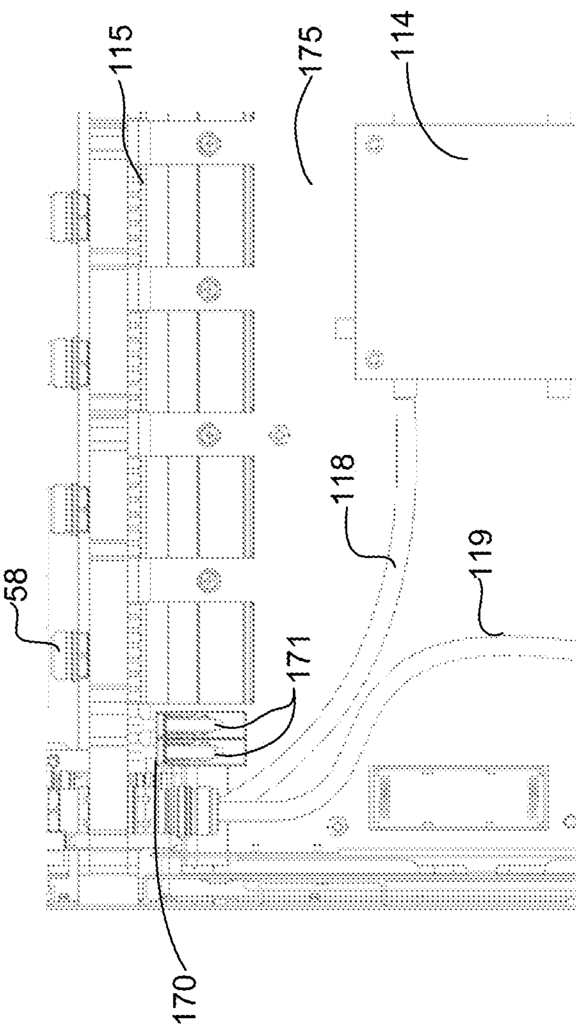
FIG. 17A is a partial top view of a line card connected to the vertical coolant distribution module with a keying guide at a connection interface, in accordance with one embodiment.
Figure 17B:
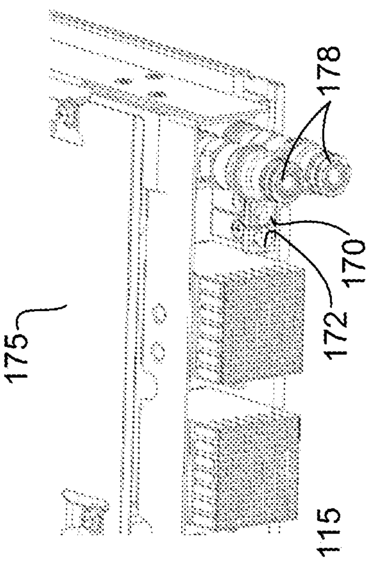
FIG. 17B is a partial front perspective of the line card shown in FIG. 17A.
Figure 17C:
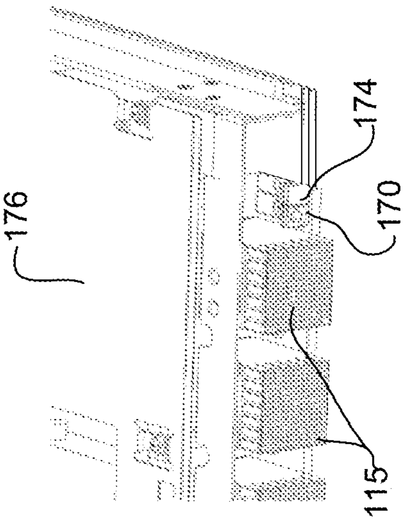
FIG. 17C is a partial front perspective of a line card configured only for air cooling with the keying guide blocked.

FIGS. 17A-17C illustrate an example of a keying member 170 disposed at an interface between horizontal and vertical modules, in accordance with one embodiment. The keying member 170 is used to align the modules and protect orthogonal cables from damage. In the example shown in FIGS. 17A-17C, receptacle block options on a horizontal line card 175 may determine the keying features. FIG. 17A shows two keyed guide pins 171 extending from the vertical adapter card and inserted into the keying member 170 on the line card 175. A second guide pin is installed on the vertical adapter card for the horizontal slot where the plumbing mates. FIG. 17B is a rear perspective of the line card 175 showing the keying member 170 with openings 172 for receiving the guide pins 171 when inserted into chassis. FIG. 17C illustrates a blocked guide receptacle 174 on keying member 170 on a line card that does not use liquid cooling.

Figure 18A:
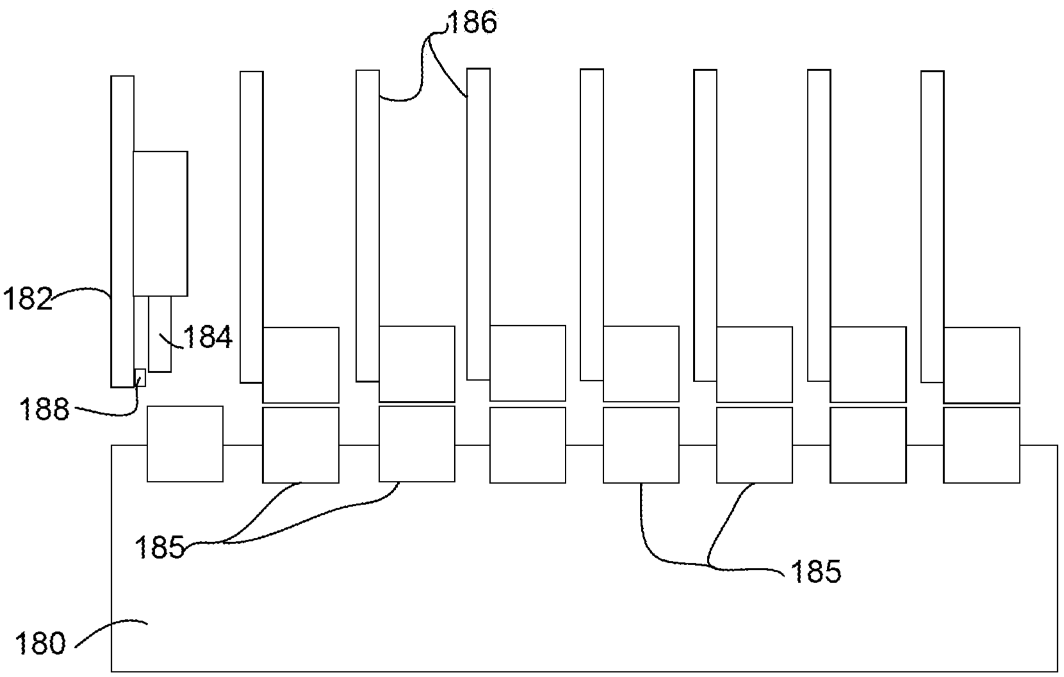
FIG. 18A is a top schematic view of an interface between an air cooled module and the coolant distribution module with a recessed liquid cooling connection, in accordance with one embodiment.
Figure 18B:
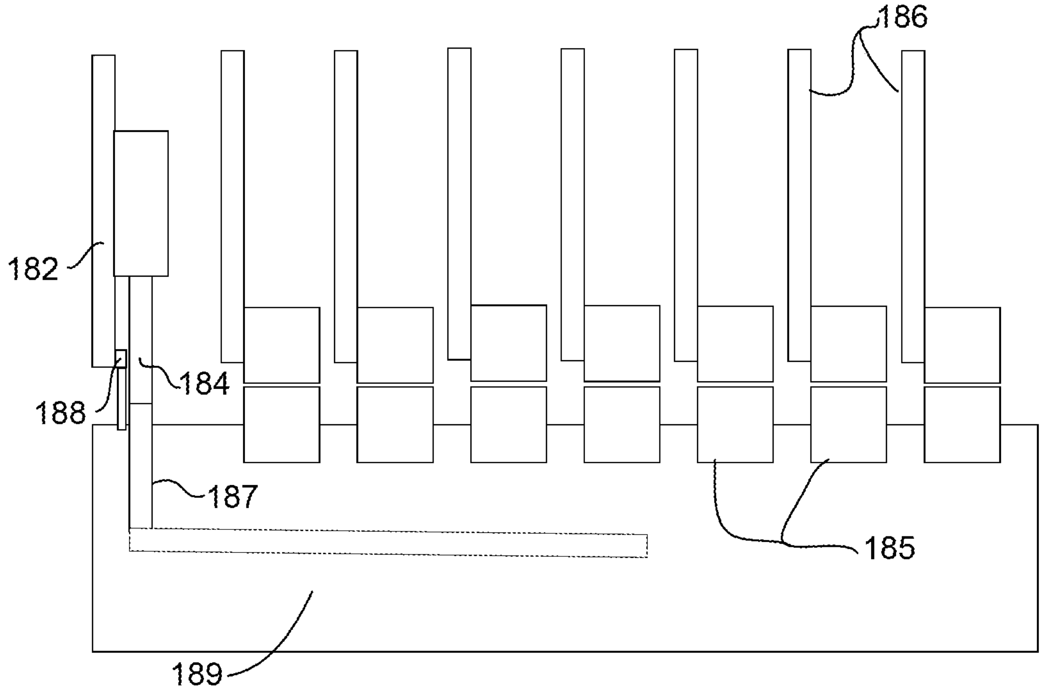
FIG. 18B is a top schematic view of an engaged connection between a liquid cooled module and the coolant distribution module of FIG. 18A.

FIGS. 18A and 18B illustrate a liquid cooling interface operable to recess from its normal operating position when not engaged (i.e., not plugged into chassis or plugged into a card that does not support liquid cooling). A horizontal line card 180, which is not configured for liquid cooling, is shown in FIG. 18A installed in a chassis with vertical coolant distribution module 182 comprising coolant infrastructure (lines/connectors) 184. In this example, the liquid cooling infrastructure 184 recesses when not engaged to prevent interference with orthogonal connector 185. The remaining orthogonal connectors 185 are connected to vertical fabric cards 186. The vertical coolant distribution module 182 includes a sensor 188 with retractable plumbing infrastructure 184 that detects when it is inserted into a slot interfacing with a card with compatible liquid cooling infrastructure, thereby preventing damage to the orthogonal connector 185 on air cooled module 180. The sensor 188 may comprise various types of mechanisms, including for example, a keying feature, push button, or near field proximity sensor. Once the vertical adapter card 182 is engaged with a corresponding horizontal liquid cooled module 189 (FIG. 18B), the coolant infrastructure 184 extends to engage with the coolant infrastructure 187 on the liquid cooled module.

Figure 19A:
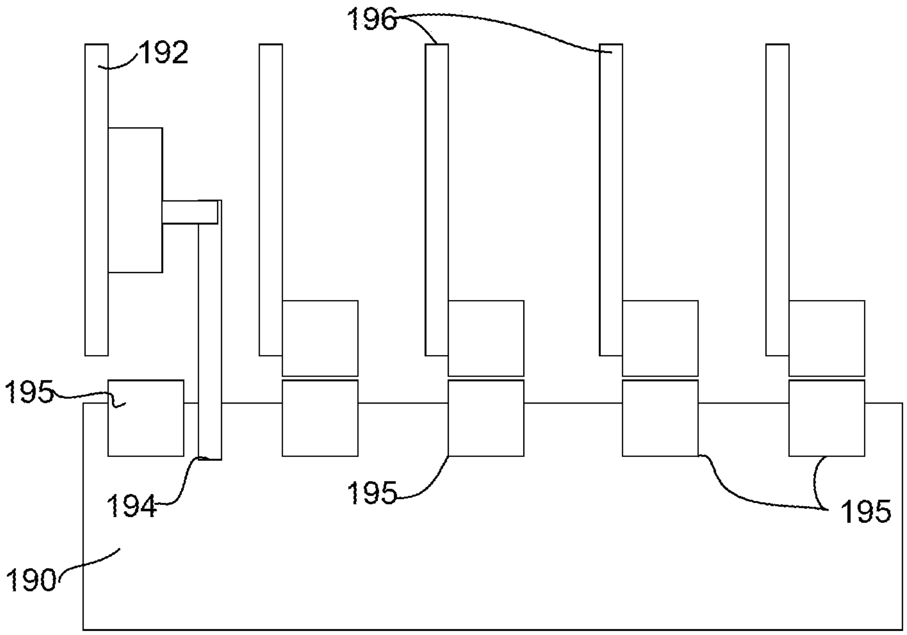
FIG. 19A is a top schematic view showing liquid cooling components of the coolant distribution module offset from an orthogonal connector on an air cooled module, in accordance with one embodiment.
Figure 19B:
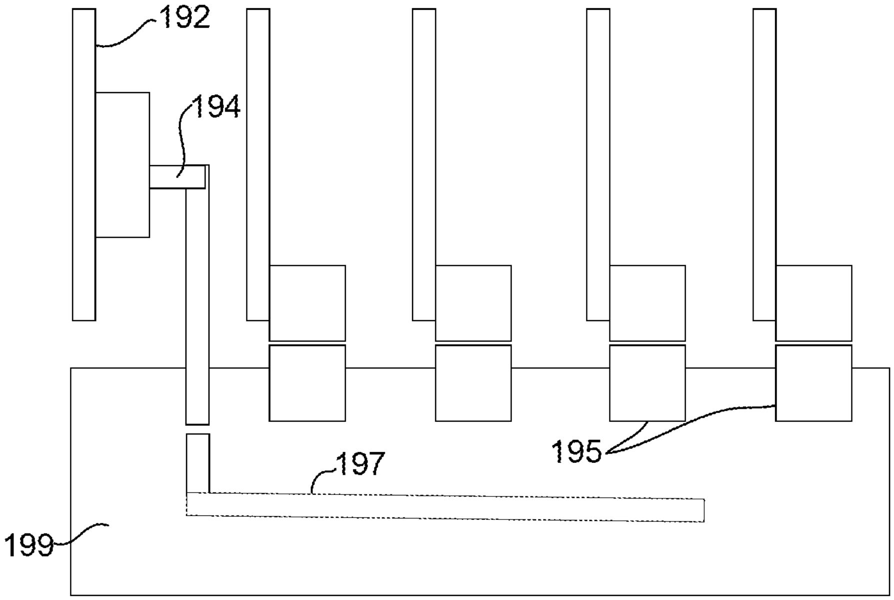
FIG. 19B is a top schematic view showing a connection between the liquid cooling components of the coolant distribution module of FIG. 19A and a liquid cooled module.

FIGS. 19A and 19B illustrate another example in which the coolant line and connector 194 are offset from the orthogonal connector 195, where adequate space is available. This allows the liquid cooling infrastructure to co-exist with the orthogonal chassis without interference and enables cards that support liquid cooling or conventional air cooled cards to interface with the coolant distribution module without risk of damage. FIG. 19A illustrates an air cooled module 190 inserted into a chassis with a vertical coolant distribution module 192 and vertical cards 196. FIG. 19B shows a liquid cooled module 199 with cooling distribution line 197 aligned with distribution line 194 on the vertical coolant distribution module 192.

Figure 20:
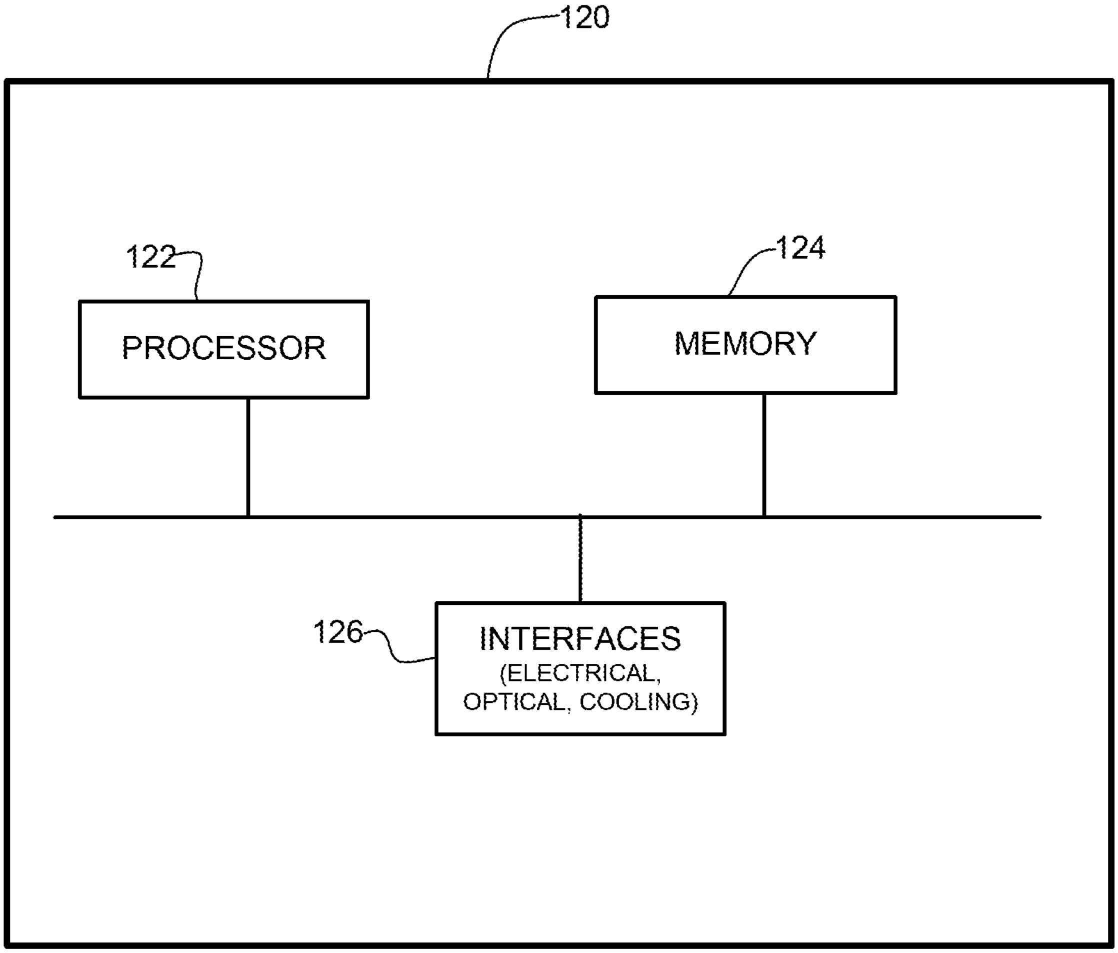
FIG. 20 is a block diagram of a network device in which embodiments described herein may be implemented.

As previously noted, the embodiments described herein may operate in the context of a network device. In one embodiment, the network device is a programmable machine that may be implemented in hardware, software, or any combination thereof. The network device 120 includes one or more processor 122, memory 124, and network interfaces (line cards, fabric cards) 126 (FIG. 20). One or more of the components (e.g., processor, memory, interfaces (data, electrical, optical, cooling)) may be located on the line card or fabric card and one or more components may be located on the coolant distribution module (e.g., cooling interfaces)

Memory 124 may be a volatile memory or non-volatile storage, which stores various applications, operating systems, modules, and data for execution and use by the processor 122. The network device 120 may include any number of memory components.

Logic may be encoded in one or more tangible media for execution by the processor 122. For example, the processor 122 may execute codes stored in a computer-readable medium such as memory 124. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 120 may include any number of processors 122.

It is to be understood that the network device 120 shown in FIG. 20 and described above is only a simplified example and that the embodiments described herein may be implemented in different configurations of network devices. For example, the network device 120 may further include any suitable combination of hardware, software, algorithms, processors, devices, components, or elements.

Figure 21:
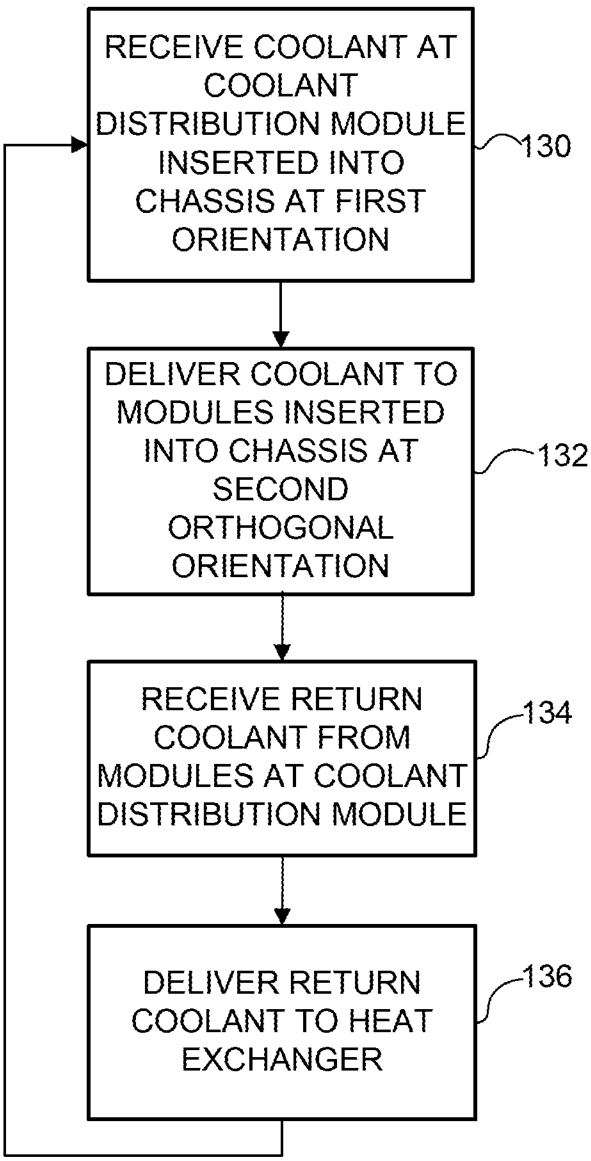
FIG. 21 is a flowchart illustrating an overview of a process for coolant distribution in an orthogonal modular electronic system, in accordance with one embodiment.

FIG. 21 is a flowchart illustrating an overview of a process for distributing coolant in a modular electronic system, in accordance with one embodiment. At step 130, coolant is received at a coolant distribution module (horizontal or vertical adapter card) inserted into a chassis at a first orientation. Coolant is delivered to modules (line cards, fabric cards) inserted into the chassis at a second orientation orthogonal to the first orientation of the coolant distribution module (step 132). Return coolant is received from the modules (step 134) and the warm (or hot) coolant is returned to a heat exchanger (step 136). The coolant flow continues while the network device is operational and coolant is supplied or until the coolant distribution module is removed.

As described above with respect to FIG. 3, a second coolant distribution module may be inserted into one of the slots in the second orientation for distributing coolant to at least one of the modules in the first orientation. The same process described above would be repeated to deliver coolant from the second coolant distribution module to one or more modules in the first orientation.

As previously described, quick disconnects are used to allow for OIR (Online Insertion and Removal) of any of the modules (line cards, fabric cards) without disrupting operation of the network device or delivery of coolant to the remaining liquid cooled modules. The coolant distribution system is configured to ensure equal pressure when horizontal or vertical cards are removed and ensure appropriate pressure to avoid condensation with varying card types. The chassis may also include one or more modules (e.g., line cards or fabric cards) that are only air cooled, as previously described.

It is to be understood that the process shown in FIG. 21 and described above is only an example and that steps may be added, combined, modified, or removed, without departing from the scope of the embodiments.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:

a chassis comprising a plurality of slots for receiving a plurality of modules, a first group of the modules received in a first orientation and a second group of the modules received in a second orientation orthogonal to said first orientation;

a coolant distribution module inserted into one of said plurality of slots in said first orientation for distributing coolant to at least one of the modules in said second group of the modules; and a second coolant distribution module inserted into one of said plurality of slots in said second orientation for distributing coolant to at least one of the modules in said first group of the modules.

2. The apparatus of claim 1 wherein the second coolant distribution module receives coolant from the coolant distribution module inserted into one of said plurality of slots in said first orientation.

3. The apparatus of claim 1 wherein one of said first and second groups of the modules comprises line cards and said other of said first and second groups of the modules comprises fabric cards.

4. The apparatus of claim 1 wherein said second group of the modules comprises line cards inserted horizontally in the chassis.

5. The apparatus of claim 1 wherein said second group of the modules comprises fabric cards inserted vertically in the chassis.

6. The apparatus of claim 1 wherein at least one of the modules of said first and second groups of modules is configured only for air cooling by a fan in the chassis.

7. The apparatus of claim 1 wherein the coolant distribution module comprises at least one external connector for receiving the coolant.

8. The apparatus of claim 1 wherein the coolant distribution module comprises a plurality of quick disconnects for mating with coolant distribution lines on a plurality of the modules in said second group of modules.

9. The apparatus of claim 1 wherein the coolant passes through a heat exchanger external to the chassis.

10. The apparatus of claim 1 wherein the coolant distribution module comprises internal connectors for mating with connectors on said second group of the modules receiving the coolant, the internal connectors offset from a location of an orthogonal connector on an air cooled module.

11. The apparatus of claim 1 wherein the coolant distribution module comprises internal connectors for mating with connectors on said second group of the modules receiving the coolant, the internal connectors operable to move between a recessed position when mating with an air cooled module and an engaged position when mating with the connectors on said second group of the modules.

12. An apparatus comprising:

a coolant distribution module for insertion into a chassis of a network device in a first orientation for delivering coolant to one or more modules inserted into the chassis in a second orientation orthogonal to said first orientation, the coolant distribution module comprising:

a plurality of internal connectors for connection to said one or more modules; and distribution lines for delivering coolant to said plurality of internal connectors.

13. The apparatus of claim 12 wherein the coolant distribution module further comprises at least one external connector for receiving the coolant from an external source.

14. The apparatus of claim 12 wherein at least one of the internal connectors is configured for distributing the coolant to a second coolant distribution module inserted into the chassis in said second orientation for distributing the coolant to one or more modules inserted into the chassis in said first orientation.

15. The apparatus of claim 12 wherein said one or more modules comprises line cards.

16. The apparatus of claim 12 wherein said one or more modules comprises a plurality of modules, at least one of the modules configured only for air cooling by a fan in the chassis.

17. A method comprising:

receiving coolant at a coolant distribution module inserted into a slot of a chassis in a first orientation;

delivering coolant to a plurality of modules inserted into a plurality of slots in the chassis in a second orientation orthogonal to said first orientation for cooling components on the modules; and delivering coolant to a second coolant distribution module inserted into one of the slots in said second orientation for delivering the coolant to a plurality of modules inserted into slots of the chassis in said first orientation.

18. The method of claim 17 further comprising air cooling one or more modules inserted into the chassis.

19. A method comprising:

receiving coolant at a coolant distribution module inserted into a slot of a chassis in a first orientation;

delivering coolant to a plurality of modules inserted into a plurality of slots in the chassis in a second orientation orthogonal to said first orientation for cooling components on the modules; and air cooling one or more modules inserted into the chassis and configured only for air cooling.

20. An apparatus comprising:

a chassis comprising a plurality of slots for receiving a plurality of modules, a first group of the modules received in a first orientation and a second group of the modules received in a second orientation orthogonal to said first orientation; and a coolant distribution module inserted into one of said plurality of slots in said first orientation for distributing coolant to at least one of the modules in said second group of the modules;

wherein the coolant distribution module comprises internal connectors for mating with connectors on said second group of the modules receiving the coolant, the internal connectors offset from a location of an orthogonal connector on an air cooled module.

21. An apparatus comprising:

a chassis comprising a plurality of slots for receiving a plurality of modules, a first group of the modules received in a first orientation and a second group of the modules received in a second orientation orthogonal to said first orientation; and a coolant distribution module inserted into one of said plurality of slots in said first orientation for distributing coolant to at least one of the modules in said second group of the modules;

wherein the coolant distribution module comprises internal connectors for mating with connectors on said second group of the modules receiving the coolant, the internal connectors operable to move between a recessed position when mating with an air cooled module and an engaged position when mating with the connectors on said second group of the modules.

* * * * *